(12) United States Patent
Wang et al.

(10) Patent No.: US 11,259,437 B2
(45) Date of Patent: Feb. 22, 2022

(54) SERVER SYSTEM

(71) Applicant: CHENBRO MICOM CO., LTD., New Taipei (TW)

(72) Inventors: Chien-Wen Wang, New Taipei (TW); Han-Chung Chien, New Taipei (TW); Sheng-Chan Lin, New Taipei (TW); Pao-Lung Wang, New Taipei (TW); Tsung Hsun Chiang, New Taipei (TW); Hao-Hsiang Hsu, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 17/080,873

(22) Filed: Oct. 27, 2020

(65) Prior Publication Data

US 2021/0127522 A1 Apr. 29, 2021

Related U.S. Application Data

(60) Provisional application No. 62/927,080, filed on Oct. 28, 2019.

(51) Int. Cl.
| | |
|---|---|
| *H05K 7/14* | (2006.01) |
| *H05K 5/02* | (2006.01) |
| *H05K 5/03* | (2006.01) |
| *H05K 7/20* | (2006.01) |

(52) U.S. Cl.
CPC ......... *H05K 7/1487* (2013.01); *H05K 5/0291* (2013.01); *H05K 5/03* (2013.01); *H05K 7/1489* (2013.01); *H05K 7/20172* (2013.01)

(58) Field of Classification Search
None
See application file for complete search history.

(56) References Cited

U.S. PATENT DOCUMENTS

| 4,864,469 | A | * | 9/1989 | Boudon | G06F 1/183 |
| | | | | | 361/679.43 |
| 5,306,079 | A | * | 4/1994 | Liu | G06F 1/183 |
| | | | | | 312/223.2 |
| 9,105,309 | B2 | * | 8/2015 | Li | G11B 33/128 |
| 9,245,587 | B2 | * | 1/2016 | Chen | G06F 1/187 |

(Continued)

FOREIGN PATENT DOCUMENTS

| TW | M471658 U | 2/2014 |
| TW | I536180 B | 6/2016 |

*Primary Examiner* — Xanthia C Cunningham
(74) *Attorney, Agent, or Firm* — ScienBiziP, P.C.

(57) ABSTRACT

A server system comprises a base, a front panel (13) arranged on the base and defining a collecting space; two doors (16) arranged on opposite sides of the base, and being perpendicular to the front panel; two storage cases (171) arranged between the doors in a back to back arrangement, and configured to receive multiple rows and columns of a plurality of storage drives horizontally, wherein two first corridors are each defined between one of the doors and one of the storage case facing the one door; two circuit boards (18) arranged between the two storage cases, wherein the two circuit boards comprise a plurality of slits, wherein a second corridor is defined between the two circuit boards; a storage cover (121) disposed above the base over the two first corridors, the second corridor, the two storage cases, and the two circuit boards.

24 Claims, 25 Drawing Sheets

(56) References Cited

U.S. PATENT DOCUMENTS

| | | | | |
|---|---|---|---|---|
| 9,532,480 B2* | 12/2016 | Shen | ................ | G06F 1/184 |
| 9,867,307 B2* | 1/2018 | Kurosaki | ............. | H05K 7/1489 |
| 9,936,611 B1 | 4/2018 | Beall et al. | | |
| 10,736,229 B2* | 8/2020 | Konovalov | ........... | G11B 33/128 |
| 2008/0037209 A1* | 2/2008 | Niazi | ................ | G06F 1/181 |
| | | | | 361/727 |
| 2011/0043994 A1* | 2/2011 | Cheng | ................ | G06F 1/187 |
| | | | | 361/679.33 |
| 2012/0293944 A1* | 11/2012 | Yi | ................ | H05K 7/1487 |
| | | | | 361/679.32 |
| 2013/0003317 A1* | 1/2013 | Gong | ................ | H05K 7/1491 |
| | | | | 361/726 |
| 2013/0050955 A1 | 2/2013 | Shinsato et al. | | |
| 2014/0125209 A1 | 5/2014 | Kyle et al. | | |
| 2015/0163964 A1* | 6/2015 | Lam | ................ | H05K 7/20154 |
| | | | | 361/679.31 |
| 2017/0031392 A1 | 2/2017 | Beall et al. | | |
| 2017/0374768 A1* | 12/2017 | Hughes | ................ | H05K 7/1487 |
| 2018/0131056 A1* | 5/2018 | Sato | ................ | H05K 7/20736 |
| 2018/0352679 A1 | 12/2018 | Monson et al. | | |
| 2019/0073006 A1* | 3/2019 | Chang | ................ | H05K 7/20709 |
| 2020/0022287 A1* | 1/2020 | Klein | ................ | F16K 3/03 |
| 2020/0236815 A1* | 7/2020 | Klein | ................ | H01L 35/28 |

\* cited by examiner

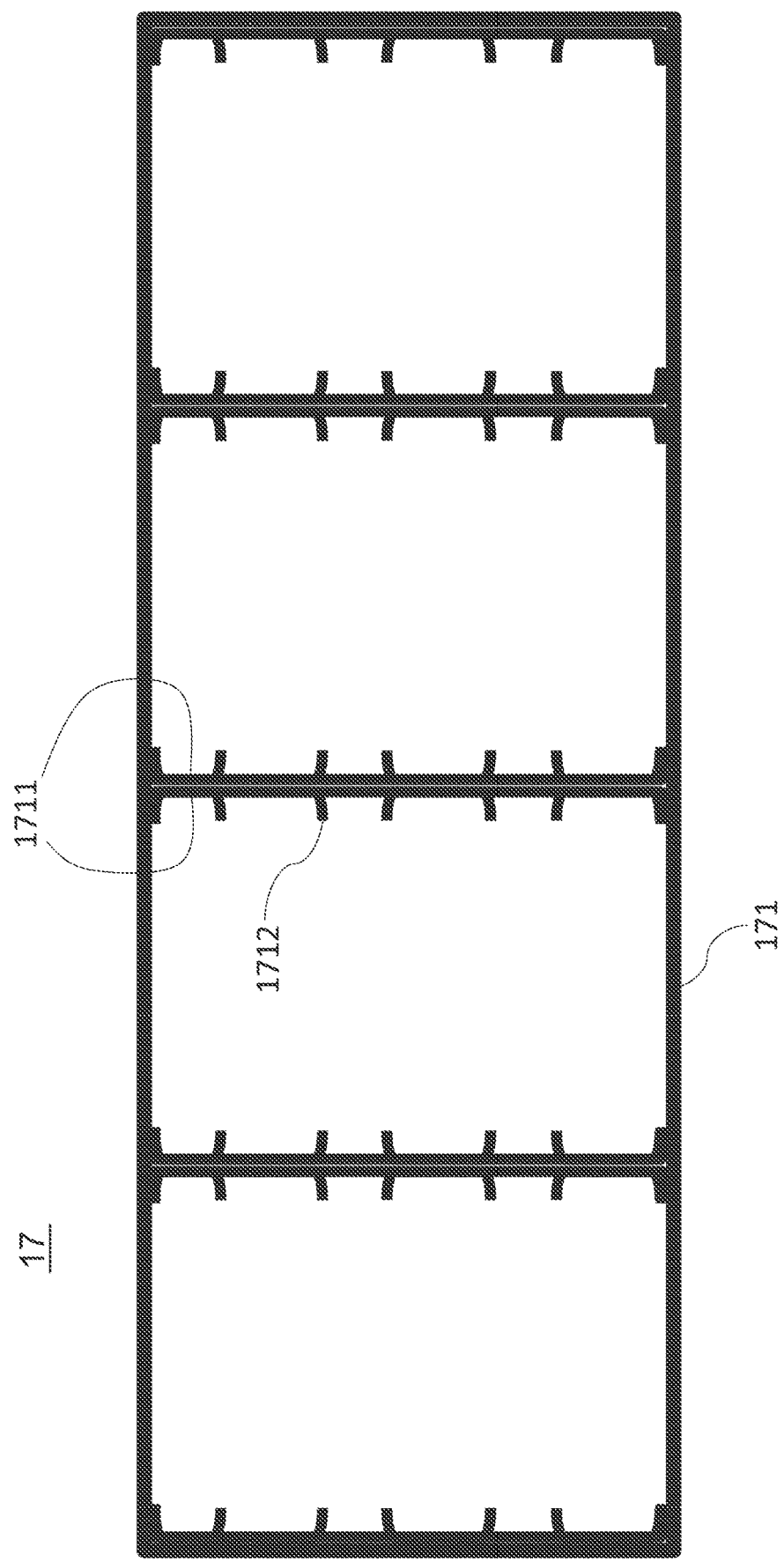

SERVER SYSTEM

CROSS-REFERENCE TO RELATED APPLICATIONS

This application claims the benefit of U.S. Provisional Patent Application No. 62/927,080 filed on Oct. 28, 2019, which is hereby incorporated by reference herein and made a part of specification.

FIELD

The present disclosure generally relates to a server system and other modules and components of the server system. More particularly, the present disclosure relates to a novel cooling arrangement of the server system, which allows effective cooling of side loading storage drives in the server system.

BACKGROUND

In a conventional arrangement, server systems are usually mounted from the front of the server system rack like a drawer, and therefore it has been intuitive to arrange the majority of storage drives of the server systems at location(s) that is near a user for easy accessibility. In other words, the storage drives (e.g., hard drives) are usually arranged at the front part of the server systems, and therefore the storage drives are typically inserted or removed from a front face or a top face of the server systems. However, insertion from the front face of the server systems naturally limits the number of the storage drives by the front face area due to industrial specified width and height; insertion from the top face of the server systems requires the user to reach from above of the server systems while inserting or removing a storage drive, which is not convenient. On the other hand, insertion from the side faces of the server systems (e.g., the flank of the server system body) may increase the number of the storage drives as well as maintain easy accessibility to each storage drives. However, having more storage drives means more heat is produced within the server system. Furthermore, more storage drives under industrial specified width and height also means less available space for cooling. Therefore, side insertion of the storage drives usually has a thermal problem, which is highly undesirable to server systems.

The present disclosure provides a new arrangement of a side loading server system that incorporates enhanced heat management capability.

SUMMARY

A server system is provided according to one embodiment of the present disclosure. The server system comprises a base (11); a front panel (13) arranged on the base and defining a collecting space; two doors (16), respectively arranged on opposite sides of the base, and being perpendicular to the front panel; two storage cases (171) arranged between the doors in back to back arrangement, and configured to receive multiple rows and columns of a plurality of horizontally arranged storage drives at front of the two storage cases, wherein two first corridors parallel to each other are each defined between one of the doors and one of the storage case facing the one door, and the two storage cases are configured to receive the plurality of storage drives in such a way that every storage drive is at least partially exposed to one first corridor that is next to the storage drive; two circuit boards (18) arranged between the two storage cases, wherein the two circuit boards comprise a plurality of slits, wherein a second corridor parallel to the two first corridors is defined between the two circuit boards; a storage cover (121) disposed above the base over the two first corridors, the second corridor, the two storage cases, and the two circuit boards; and a fan bracket (191) arranged on the base in a door to door direction and configured to receive a fan unit to introduce air into the server system through the collecting space, the two first corridors, the two storage cases, the plurality of slits on the two circuit boards and the second corridors in sequence, wherein the storage cases are between the fan bracket and the front panel.

In one embodiment, the server system further comprises an air stopper arranged at ends of the two first corridors away from the front panel, and the air stopper is configured to stop air in the first corridor from flowing toward the fan bracket without passing through the storage cases and the circuit boards.

In one embodiment, the air stopper is a first support arranged between the fan bracket and the storage cases in door to door direction with respect to the server system, and configured to increase structural strength of the server system, wherein the first support comprises an opening communicating the second corridor and the fan bracket.

In one embodiment, the collecting space is perpendicular to the second corridor.

In one embodiment, the collecting space is not in direct communication with the second corridor.

In one embodiment, the server system further comprises an UI module configured to separate the collecting space from the second corridor.

In one embodiment, the front panel comprises a plurality of air inlets and a plurality of air outlets, and the collecting space is further defined between the plurality of air inlets and the plurality of air outlets, and wherein a total area of the plurality of air inlets is larger than a total area of the plurality of air outlets.

In one embodiment, a length of one of the doors is equal to or longer than a length of one of the storage cases.

In one embodiment, the plurality of slits is arranged in multiple columns on one of the circuit boards behind one of the storage cases, and a number of the multiple columns of the plurality of slits on the one circuit board is corresponding to a number of columns of the plurality of storage drives the one storage case configured to receive.

In one embodiment, the plurality of slits comprises a minor slit arranged at a top edge of one of the two circuit boards.

In one embodiment, the server system further comprises an UI module at least partially dividing the collecting space into two equal sections.

In one embodiment, the server system further comprises two seals arranged on an inner face of one of the doors, wherein one of the seals is arranged proximal to the storage cover and the other is arranged proximal to the base when the one door is closed.

In one embodiment, the storage cases are configured to receive multiple 3.5-inch storage drives.

In one embodiment, one of the storage cases is further configured to receive the plurality of storage drives that occupies 70% or more of a physical capacity of the one storage case.

In one embodiment, one of the circuit boards comprises multiple drive connectors, wherein each of the multiple drive connectors is arranged in proximity to any one of the plurality of slits.

In one embodiment, the server system further comprising at least two from: a first support, a second support, and a third support.

In one embodiment, the fan bracket comprises a recess portion allowing multiple cables from the circuit boards to bypass the fan bracket.

In one embodiment, the server system further comprises a second support arranged between the storage cases and coupled perpendicularly to the front panel.

In one embodiment, the server system further comprises a plurality of fan units disposed on one side of the storage cases while the front panel being on the other side of the storage cases, wherein the fan units are configured to draw air into the server system.

In one embodiment, the base further comprises a bump between one of the storage cases and one of the doors corresponding to the one storage case, wherein the bump is configured to support the storage drives at a most bottom row of the one storage case when the storage drives are inserted or removed from the one storage case.

In one embodiment, wherein the two doors comprises a stepped structure each, and each stepped structure divides one door into an upper portion and a lower portion, and the lower portion is dented into the server system with respect to the upper portion, and wherein the two doors are configured to receive racking rails beneath the stepped structures when the server system is completely within a rack.

In one embodiment, the server system further comprises a fan cover covering over the fan bracket, wherein the fan cover is configured to be removed individually from the server system.

In one embodiment, one of the storage cases comprises a double layered column partition with a row rail integrated on the double layered column partition.

A server system is provided according to another embodiment of the present disclosure. The server system comprises a base (11); a front panel (13) arranged on the base and defining a collecting space; two doors (16), respectively arranged on opposite sides of the base, and being perpendicular to the front panel; two storage cases (171) arranged between the doors in back to back arrangement, and configured to receive multiple rows and columns of a plurality of horizontally arranged storage drives at front of the two storage cases, wherein two first corridors parallel to each other are each defined between one of the doors and one of the storage case facing the one door, and the two storage cases are configured to receive the plurality of storage drives in such a way that every storage drive is at least partially exposed to one first corridor that is next to the storage drive; two circuit boards (18) arranged between the two storage cases, wherein the two circuit boards comprise a plurality of slits, wherein a second corridor parallel to the two first corridors is defined between the two circuit boards; a storage cover (121) disposed above the base over the two first corridors, the second corridor, the two storage cases, and the two circuit boards; and a plurality of fan units (192) arranged on the base in a door to door direction such that the storage cases are between the plurality of fan units and the front panel, and the plurality of fan units are configured to introduce air into the server system through the collecting space, the two first corridors, the two storage cases, the plurality of slits on the two circuit boards and the second corridors in sequence.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

FIG. 10-1 illustrates the A-A cross-sectional view of FIG. 10 according to one embodiment of the present disclosure.

FIG. 11 illustrates a front view of a storage case according to one embodiment of the present disclosure.

DETAILED DESCRIPTION

Figure 1:
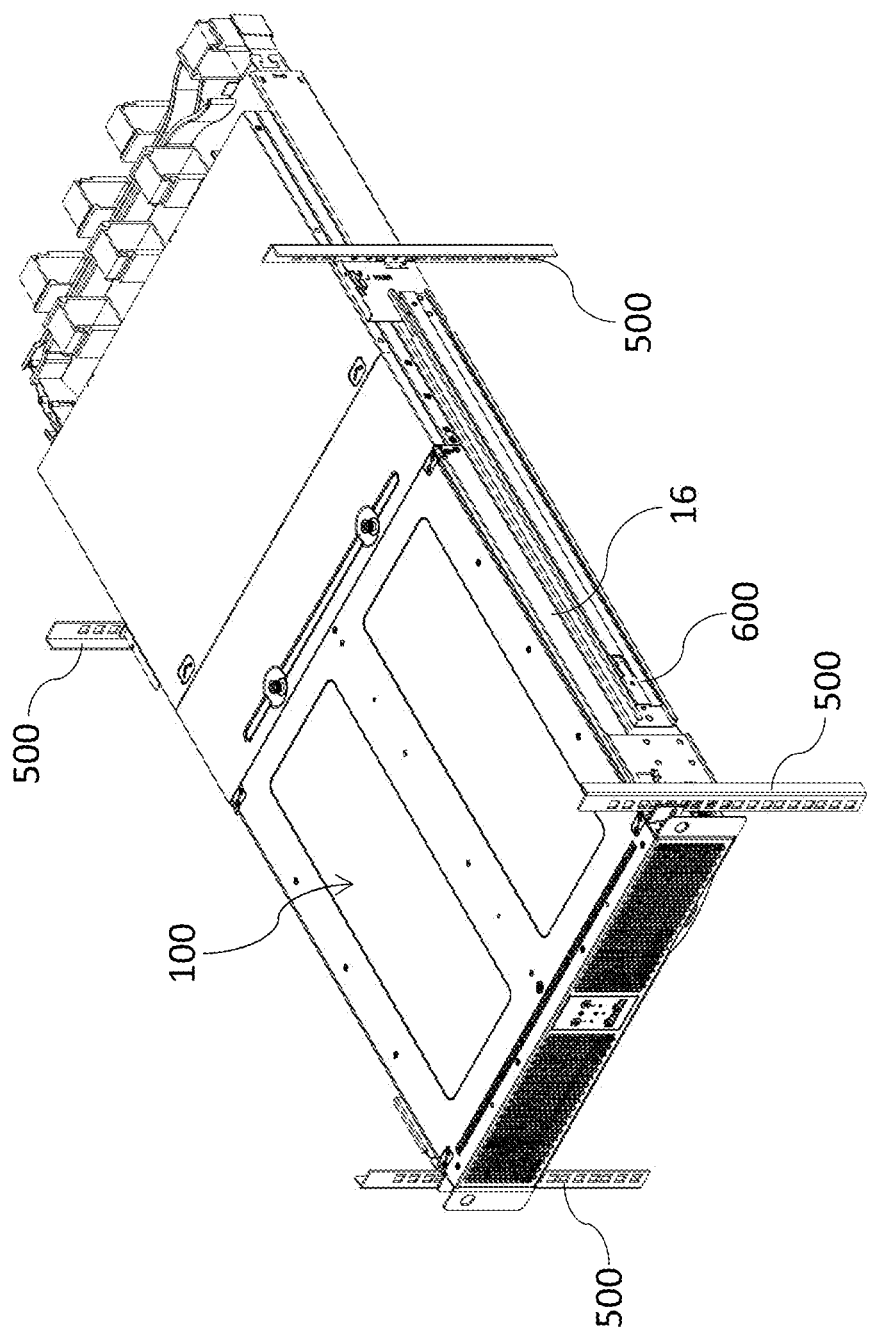
FIG. 1 illustrates an isometric view of a server system mounted to a rack according to one embodiment of the present disclosure.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Figure 2:
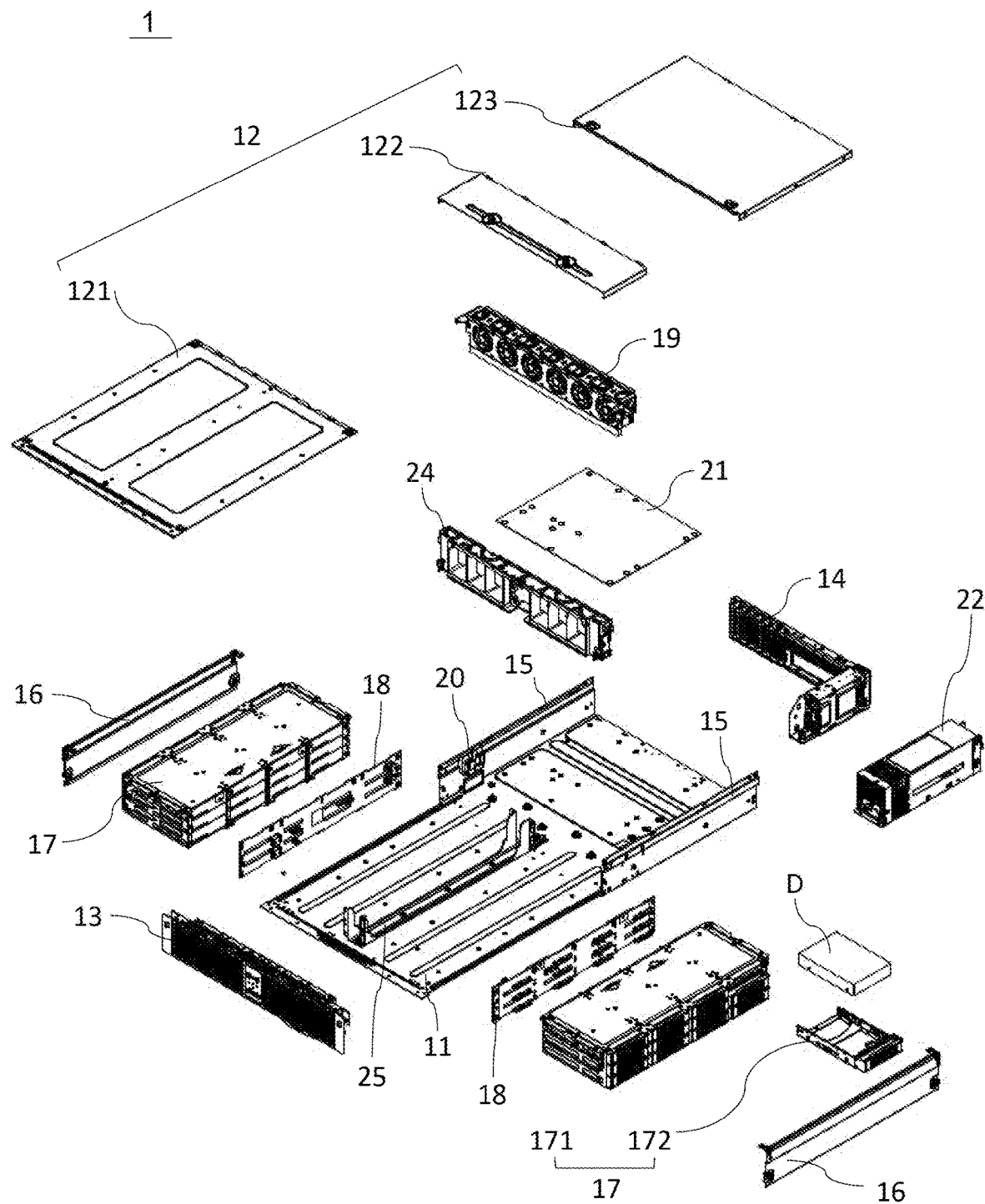
FIG. 2 illustrates an exploded view of a server system without the rack according to one embodiment of the present disclosure.
Figure 3:
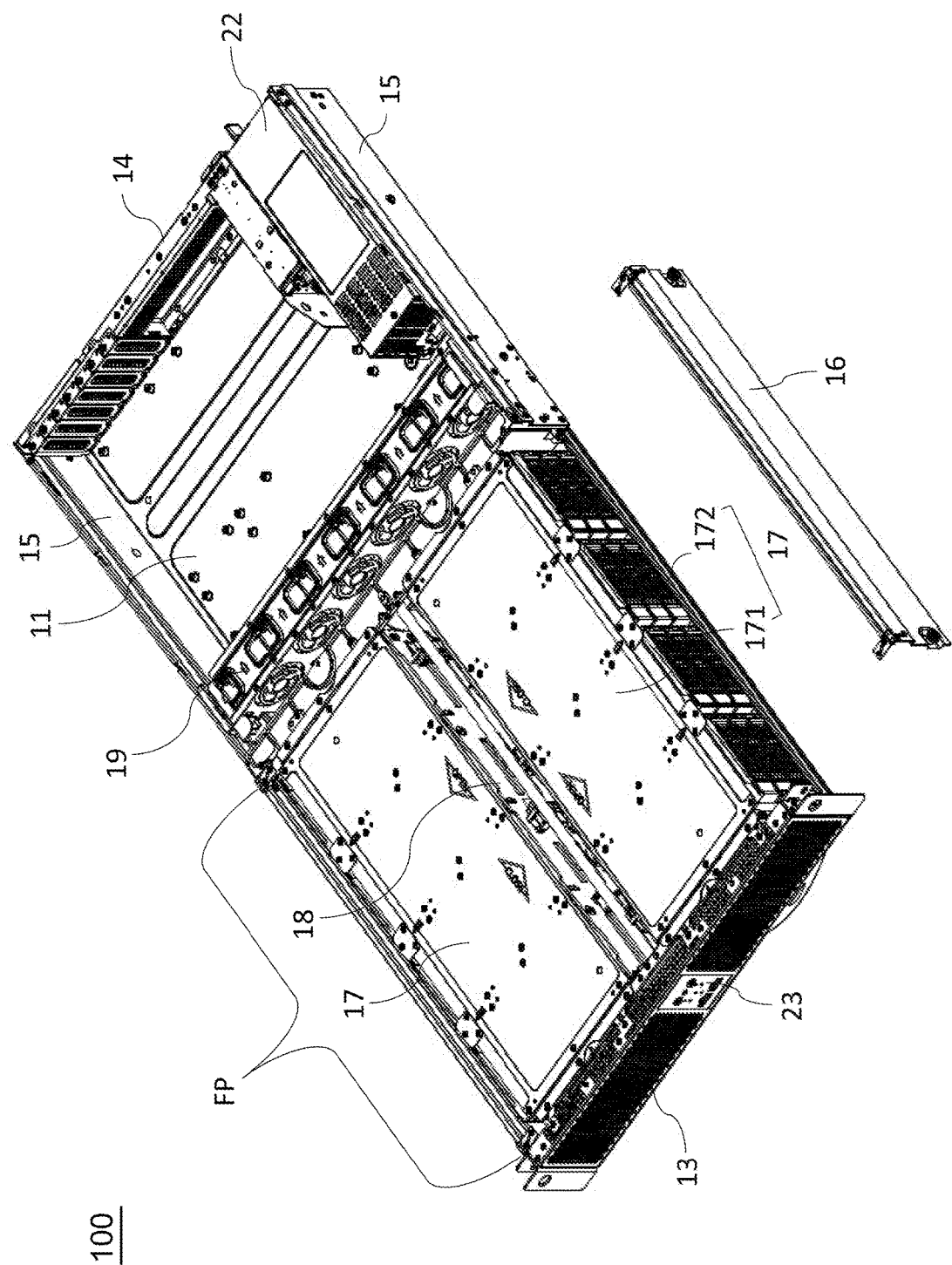
FIG. 3 illustrates an isometric view of a server system according to one embodiment of the present disclosure.

According to one embodiment of the present disclosure, FIG. 1 illustrates a server system 100 mounted to a rack 500; FIG. 2 illustrates an exploded view of the server system 100 without the rack 500; FIG. 3 illustrates the arrangements in the server system 100. Referring to FIG. 2 and FIG. 3, the server system 100 comprises a base 11, a top cover 12, a front panel 13, a back panel 14 parallel to the front panel 13, a pair of side walls 15 parallel to each other, two doors 16 parallel to each other, two storage modules 17, two circuit boards 18, a fan module 19, a pair of fan mounts 20, a board insulator 21, a motherboard (not shown), and a power module 22. In one embodiment, the base 11 is a rectangular plate having two long sides and two short sides. The front panel 13 and the back panel 14 are each arranged at one of the two short sides of the base 11; the side walls 15 and the doors 16 are arranged at the long sides of the base 11, and each long side of the base 11 has a side wall 15 proximal to the back panel 14 and a door 16 proximal to the front panel 13. Furthermore, the side wall 15 and the door 16 on the same side of the base 11 are aligned with each other. The storage modules 17, the circuit boards 18, the fan module 19, the board insulator 21, the motherboard, and the power module 22 are disposed on the base 11. The storage modules 17 comprises a storage case 171, and a plurality of drive bays 172. The drive bays 172 are configured to carry a plurality of storage drives D, and the storage drives D can be inserted into the storage case 171 horizontally with the drive bays 172 from the front of the storage module 17. In one embodiment, the drive bays 172 can be integrated into the storage case 171, and thus the drive case 171 can receive the storage drives D by itself. The storage modules 17 are arranged between the doors 16 in a back to back arrangement, and each of the storage modules 17 is facing one of the doors 16. In other words, the storage modules 17 are facing the long side of the base 11. Since the storage modules 17 are facing the doors 16, the drive bays 172 and the storage drives D cannot be removed from the storage case 171 when the doors 16 are closed. Each of the circuit boards 18 is vertically arranged with respect to the base 11 at the back of one of the storage modules 17, so the circuit boards 18 are standing behind and between the storage modules 17. Therefore, the circuit boards 18 can be electrically coupled to the storage drives D in the storage modules 17 without cables in between. In one embodiment, the circuit boards 18 are printed circuit boards configured to couple the storage drives D to the motherboard. The fan module 19 is arranged between the side walls 15 and configured to cool the storage modules 17 and the circuit boards 18. The pair of fan mounts 20 are arranged separately in proximity to different side walls 15, and the fan module 19 can be installed to the server system 100 by coupling to the pair of fan mounts 20. As such, the fan module 19 sits across the base 11 in a side to side direction in the server system 100. The motherboard is arranged on the board insulator 21 between the fan module 19 and the back panel 14, and the motherboard is electrically coupled to the circuit boards 18, the fan module 19, and the power module 22. The power module 22 is arranged between the side walls 15 closer to the back panel 14 than the fan module 19, and the back of the power module 22 is aligned with the back panel 14, and thus the back panel 14 does not cover the back of the power module 22 as such. Therefore, the power module 22 can be removed from the server system 100 independently. The top cover 12 is disposed above the base 11 over the storage modules 17, the circuit boards 18, the fan module 19, the motherboard, and the power module 22. Therefore, the base 11, the top cover 12, the front panel 13, the back panel 14, the side walls 15, the doors 16, and the power module 22 together form an enclosure accommodating the storage modules 17, the circuit boards 18, the fan module 19, the fan mounts 20, the board insulator 21, and the motherboard.

In one embodiment of the present disclosure, the top cover 12 comprises a storage cover 121 covering over the storage modules 17 and the circuit boards 18, a fan cover 122 covering over the fan module 19, and a motherboard cover 123 covering over the motherboard. Therefore, the storage modules 17 with the circuit boards 18, the fan module 19, and the motherboard can be accessed individually from the top of the server system 100 for maintenance by removing corresponding portion of the top cover 12.

Figure 4:
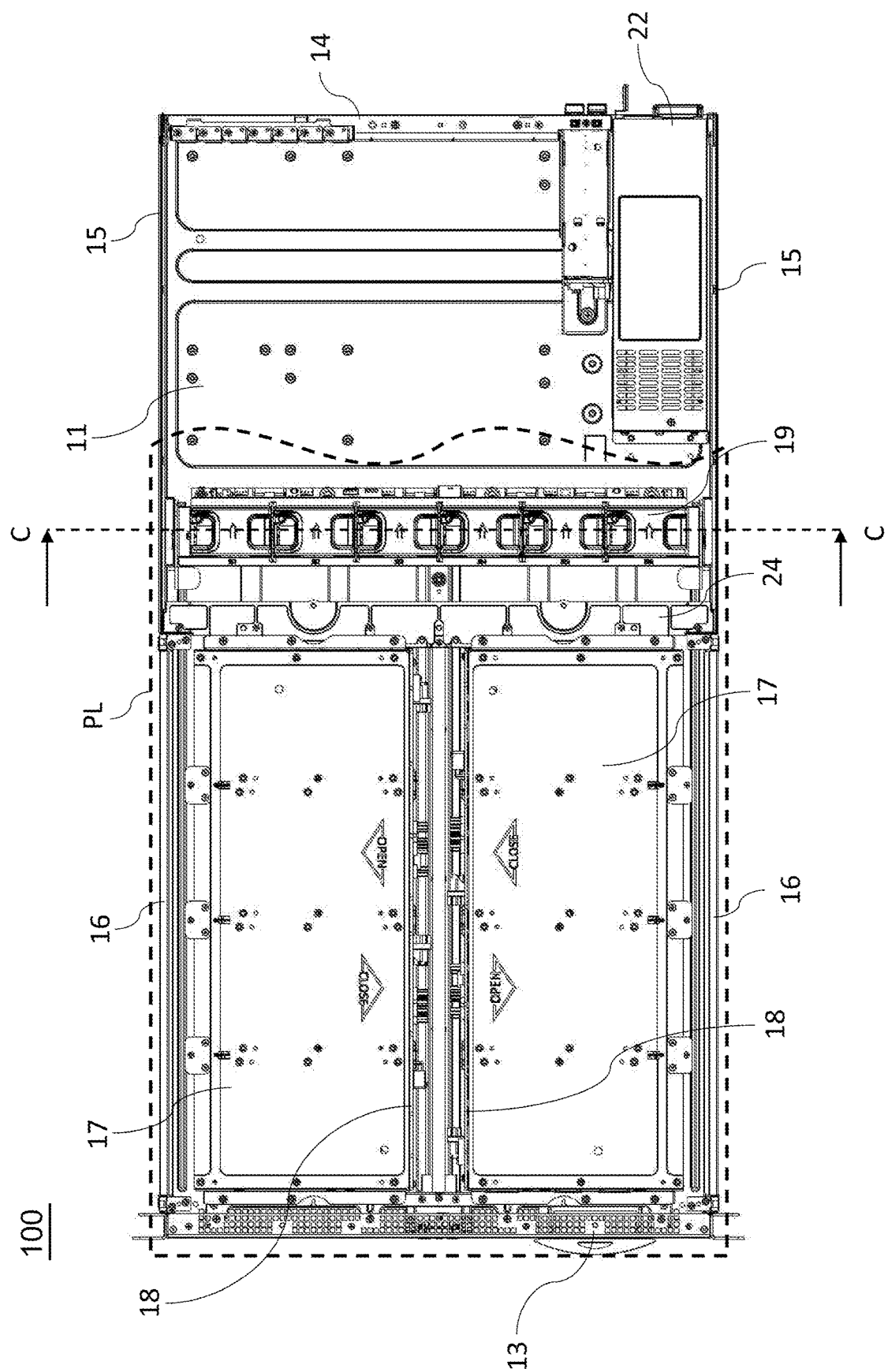
FIG. 4 is a top view of FIG. 3 according to one embodiment of the present disclosure.
Figure 5:
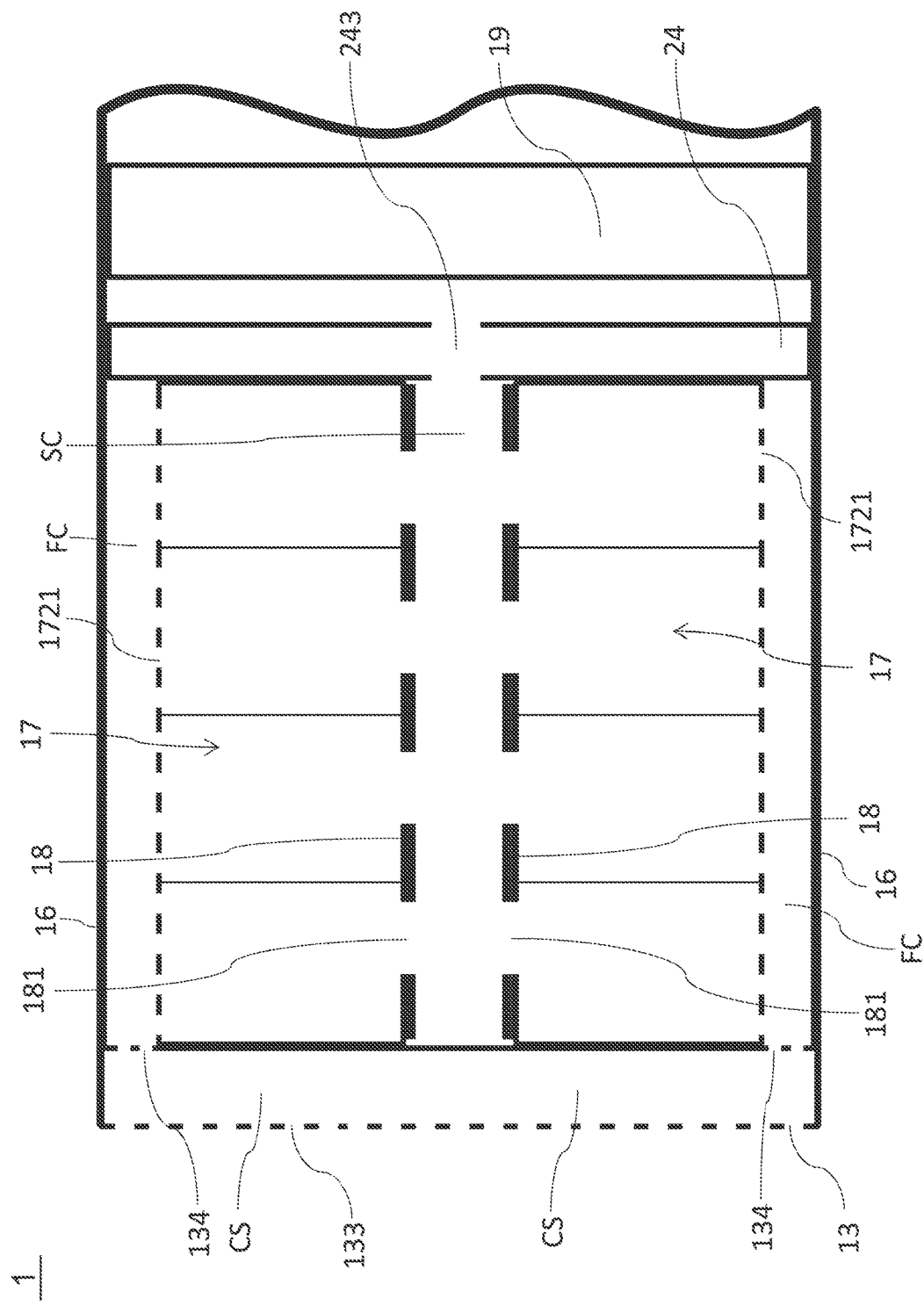
FIG. 5 is a simplified partial layout PL of FIG. 4 according to one embodiment of the present disclosure.

FIG. 4 is a top view of FIG. 3 and FIG. 5 is a simplified partial layout PL of FIG. 4 according to one embodiment of the present disclosure. Referring to FIG. 4 and FIG. 5, a cooling arrangement of the server system 100 in accordance to an embodiment of the instant disclosure (e.g., for the storage modules 17 and the circuit boards 18 thereof) will be described below.

To cool the server system 100, the fan module 19 is configured to draw air into the server system 100 at the front panel 13 and blow air out of the server system 100 at the back panel 14. Between the front panel 13 and the back panel 14, the air driven by the fan module 19 flows through and cool the storage modules 17 and the circuit boards 18. More specifically, as shown in FIG. 5, the air flows into a collecting space CS in the front panel 13 through multiple air inlets 133 of the front panel 13, and then the air exits the front panel 13 through multiple air outlets 134 at the sides of the collecting space CS. And then, the air flows into two first corridors FC between the front panel 13 and the storage modules 17. The pair of first corridors FC refer to the space situated inside the doors 16 and in front of the storage modules 17 as shown in FIG. 5, so each of the two first corridors FC is defined between one of the doors 16 and one of the storage modules 17 facing the door 16. The server system 100 further comprises a first support 24 arranged at the end of the first corridor FC and on a side closer to the back panel 14 of the storage modules 17, and the first support 24 acting as an air stopper is configured to stop the air in the first corridor FC from flowing toward the fan module 19 without passing through the storage modules 17 and the circuit boards 18. In one embodiment, the server system 100 can comprise other types of air stoppers disposed at the end of the two first corridors FC instead of or in addition to the first support 24, for example, airtight sealant, airtight foam, airtight tape, etc. As a result, the air flows from the two first corridors FC into the storage modules 17 through multiple air holes 1721 thereof, and then the air leaves the storage module 17 from the multiple slits 181 on the circuit boards 18. As such, the air enters a second corridor SC which is a space defined between the circuit boards 18. As the fan module 19 continues drawing, the air from the second corridor SC is driven through an opening 243 of the first support 24 between the second corridor SC and the fan module 19. In the end, the air passes through the fan module 19 and leaves the server system 100 from the back panel 14. The two first corridors FC are parallel to the second corridor SC, whereas the collecting space CS is perpendicular to the second corridor SC. It should be noted that, the collecting space CS in the front panel 13 should not be in direct communication with the second corridor SC between the storage modules 17.

Figure 6:
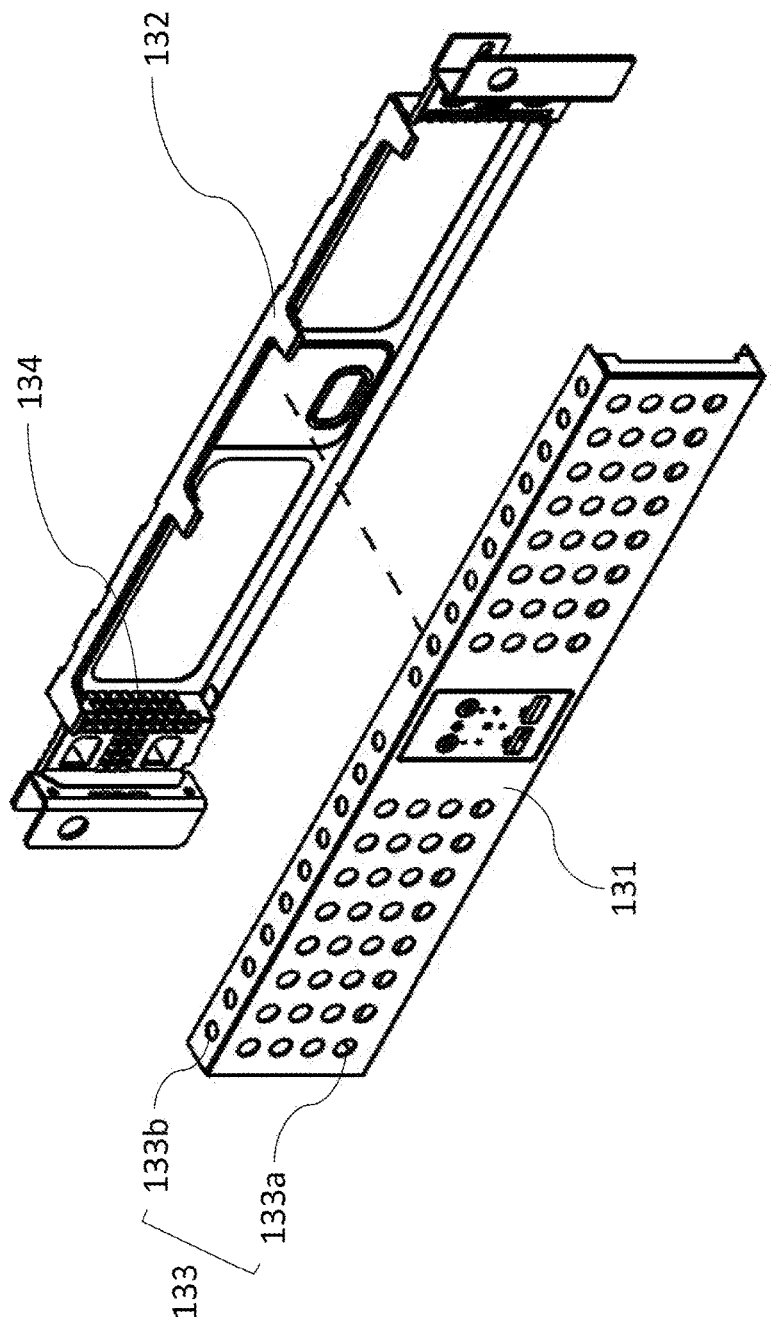
FIG. 6 illustrates an exploded view of a front panel according to one embodiment of the present disclosure.

FIG. 6 illustrates the front panel 13 being disassembled according to one embodiment of the present disclosure. The front panel 13 comprises an external frame 131, multiple air inlets 133, multiple air outlets 134, and an internal frame 132. The front panel 13 can be installed to the server system 100 by coupling the internal frame 132 between the side of storage modules 17 and the base 11, and the external frame 131 is coupled to the internal frame 132 to form the collecting space CS. The multiple air inlets 133 are arranged on the external frame 131. In addition, the multiple air inlets 133 comprise a major air inlet 133a arranged at the front of the front panel 13 and a minor air inlet 133b arranged at the top and/or at the bottom (not shown) of the front panel 13. In other words, the major air inlet 133a and the minor air inlet 133b are arranged at different faces of the front panel 13. The multiple air outlets 134 are arranged to the sides of the internal frame 132, and thus corresponding to the two first corridors FC in position. In comparison, the total area of the multiple air inlets 133 is larger than the total area of the multiple air outlets 134, as such compressing the air and increasing the flowrate around the multiple air outlets 134.

Figure 7:
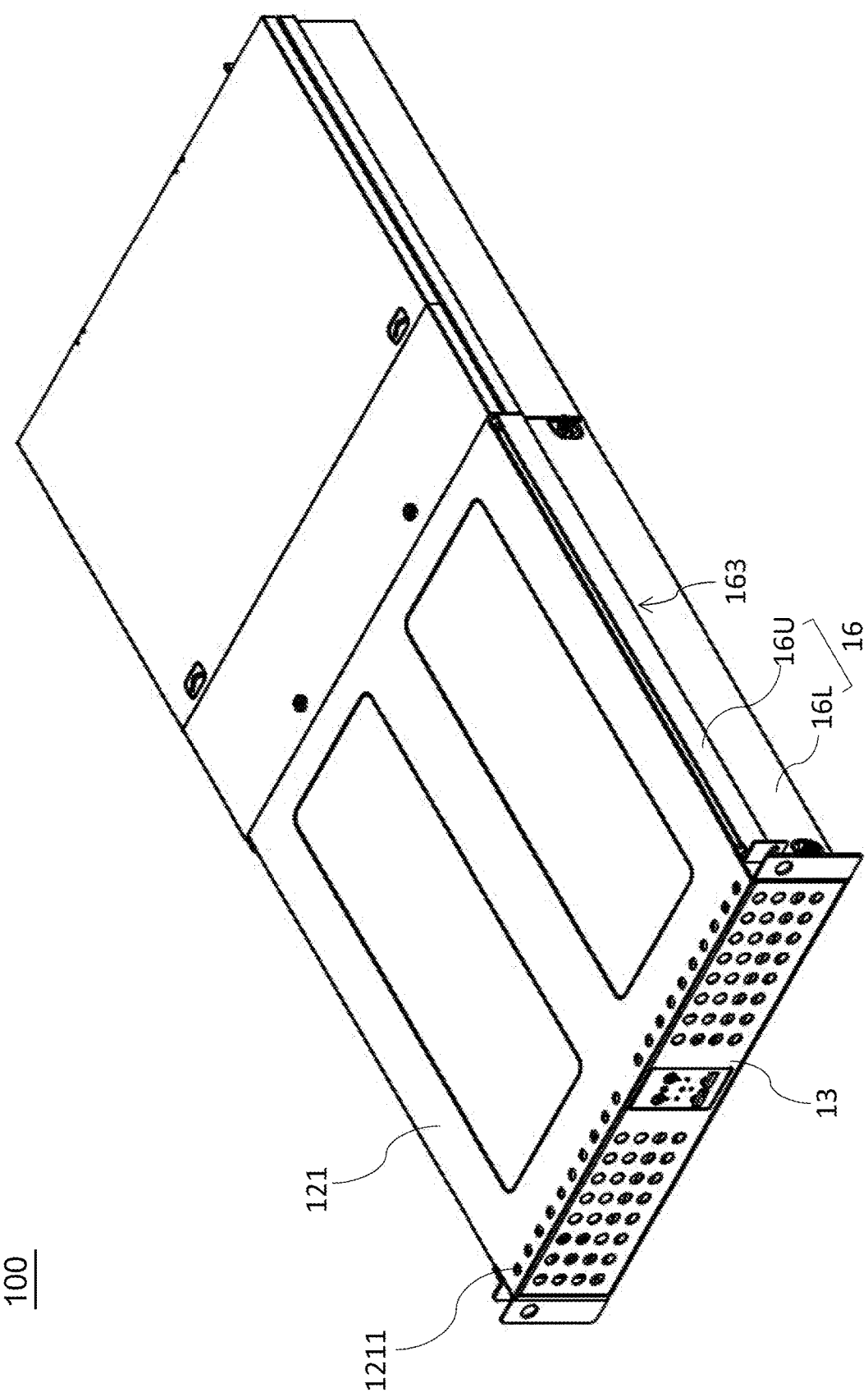
FIG. 7 illustrates another isometric view of a server system according to one embodiment of the present disclosure.
Figure 8:
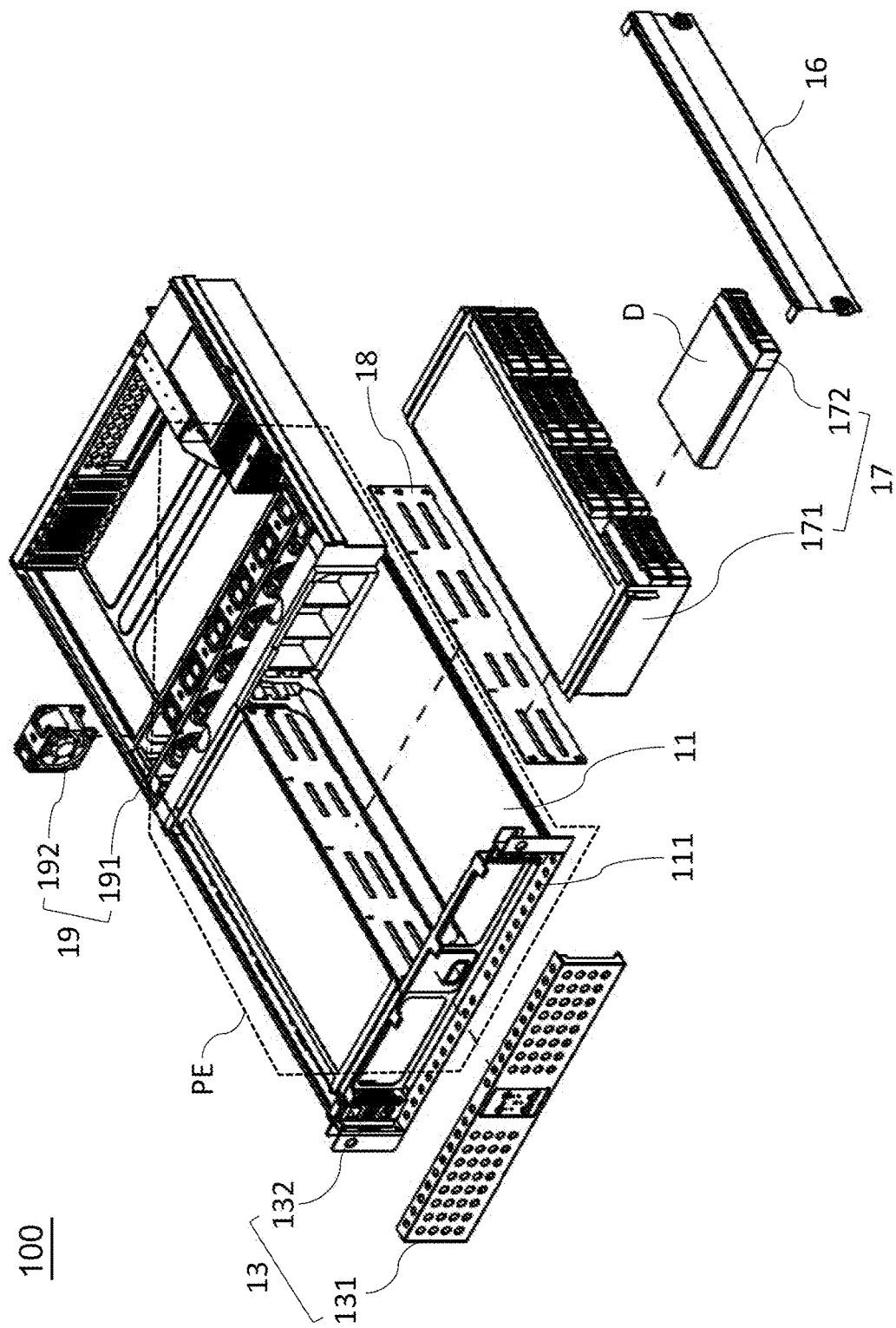
FIG. 8 illustrates another exploded view of a server system according to one embodiment of the present disclosure.

In one embodiment of the present disclosure, FIG. 7 shows the storage cover 121 comprising a cover punch 1211 if the minor air inlet 133b is arranged at the top of the front panel 13, and the cover punch 1211 is corresponding to the minor air inlet 133b in position. Therefore, the air can be drawn through the cover punch 1211 of the storage cover 121 that leads into the collecting space CS of the front panel 13. In another embodiment of the present disclosure, FIG. 8 shows the base 11 comprising a base punch 111 if the minor air inlet 133b is arranged at the bottom of the front panel 13, and the base punch 111 is corresponding to the minor air inlet 133b in position. Therefore, the air can be drawn through the base punch 111 of the base 11 that leads into the collecting space CS of the front panel 13. Back to FIG. 7, in one embodiment of the present disclosure, each of the doors 16 comprises a stepped structure 163 which divides the door 16 into an upper portion 16U and a lower portion 16L, and the lower portion 16L is dented into the server system 100 with respect to the upper portion 16U. Therefore, the doors 16 are configured to receive racking rails 600 beneath the stepped structures 163 when the server system 100 is completely within the rack 500 as shown in FIG. 1, such that the overall weight of the server system 100 can be evenly distributed between the front panel 13 and the back panel 14 without fixing the racking rails 600 to the doors 16.

Figure 9:
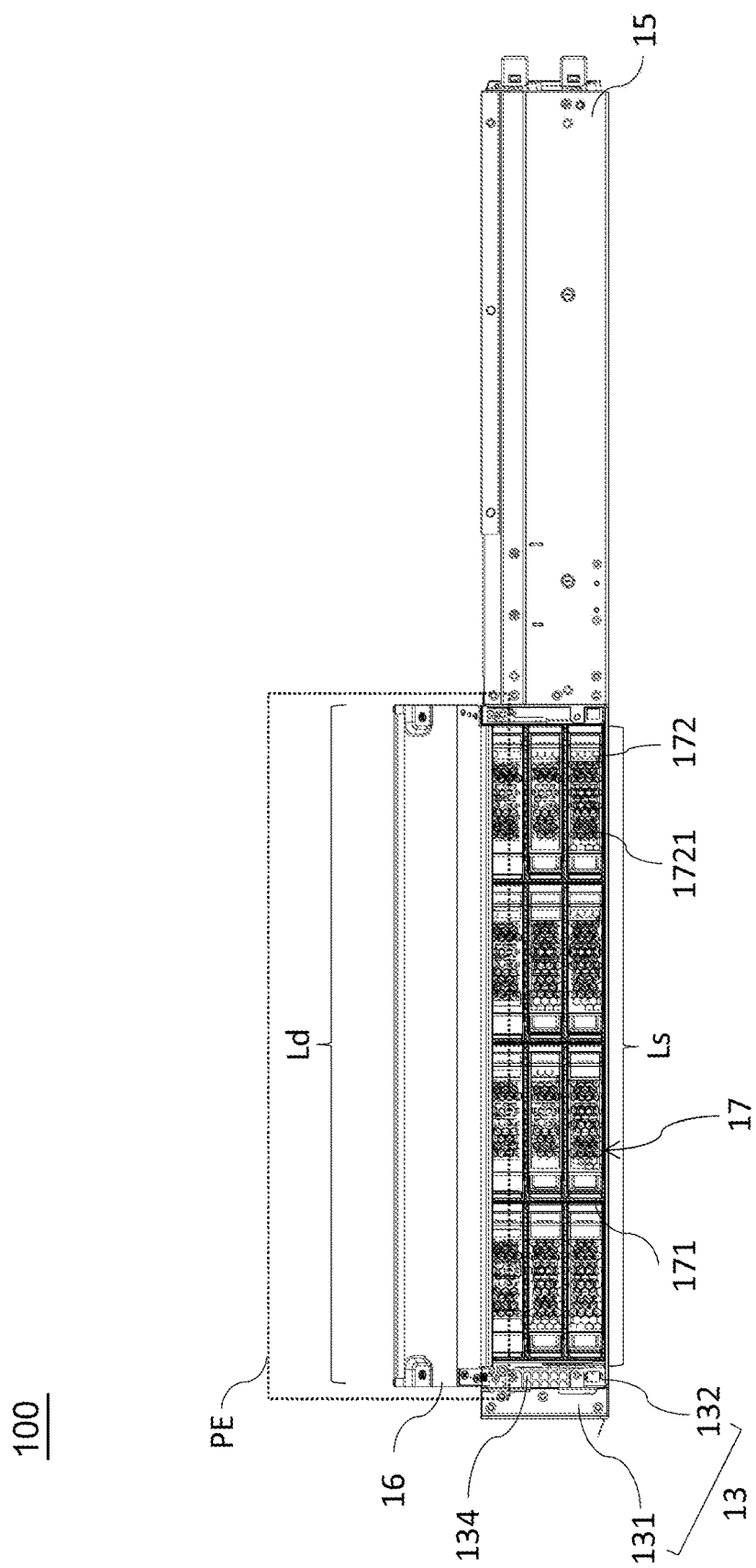
FIG. 9 illustrates a side view of a server system according to one embodiment of the present disclosure.

FIG. 9 is a side view of the server system 100 with the door 16 opened according to one embodiment of the present disclosure. The server system 100 depicted in FIG. 9 is a 2 U rack mount server unit, and each storage case 171 of the two storage modules 17 is configured to carry twelve drive bays 172, hence twelve storage drives D as shown. Therefore, the server system 100 with two storage modules 17 is configured to load twelve storage drives D on each side, and twenty-four storage drives D in total as such. The multiple air inlets 1721 are arranged at the front of the drive bays 172 in the storage modules 17. Since both the air outlets 134 and the air holes 1721 are in communication with the first corridors FC, and thus allowing the air drawn by the fan module 19 flows from the collecting space CS into the drive bays 172. The length Ld of the doors 16 is equal to or longer than the length Ls of the storage modules 17, that not only shields the storage modules 17 from dust, but also ensures the first corridors FC defined inside the doors 16 communicating all the air holes 1721 when the doors 16 are closed, such that all the air from the multiple air outlets 134 can flow into the storage module 17. Since the doors 16 should be longer than the storage modules 17, the side walls 15 is not overlapped with the storage modules 17. Though the length Ls of the storage module 17 is equal to the length of the storage case 171 in this embodiment. In another embodiment where a storage case 171 is not provided, the length Ls can represent an overall length of a plurality of storage drives D that is mounted to the server system 100 on one side.

Figure 10:
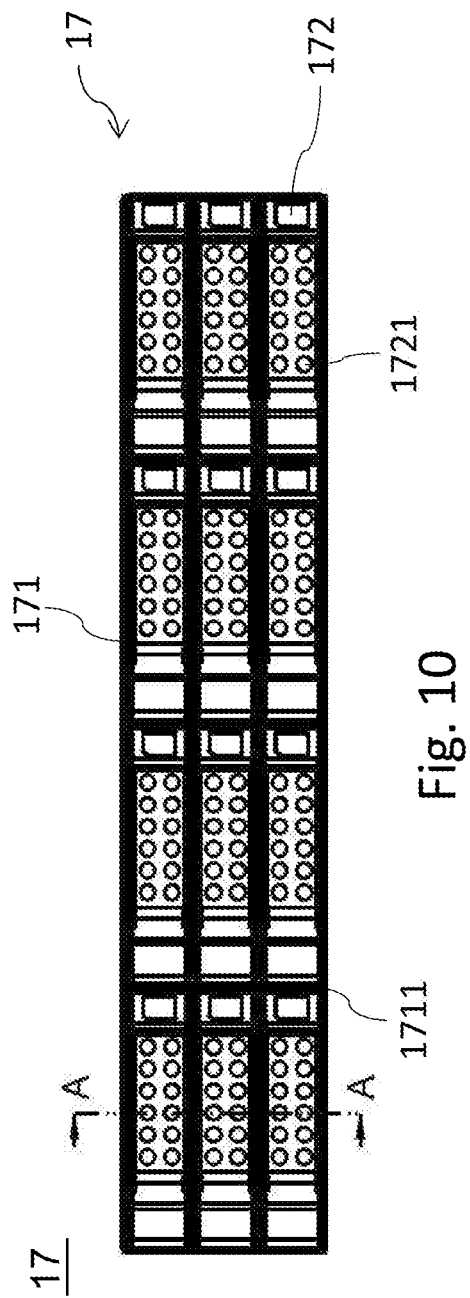
FIG. 10 illustrates a front view of a storage modules according to one embodiment of the present disclosure.
Figures 1, 10:
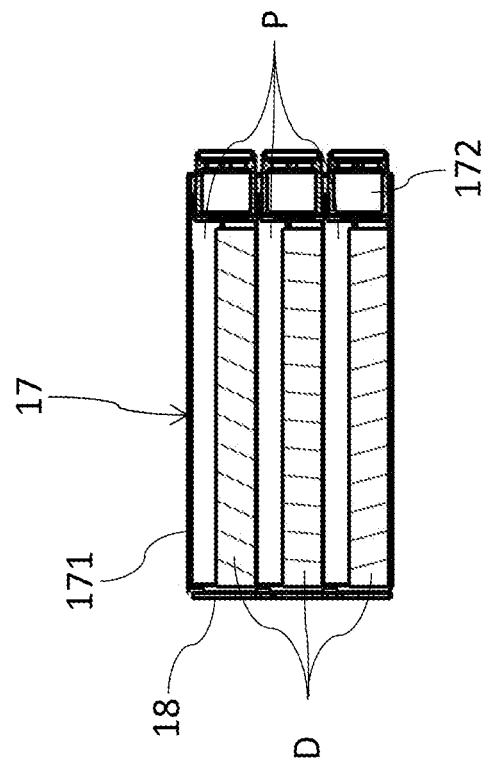

According to one embodiment of the present disclosure, FIG. 10 illustrates one of the storage modules 17 with a circuit board 18 behind; FIG. 10-1 illustrates a A-A cross-sectional view of FIG. 10; FIG. 11 illustrates one of the storage cases 171. As shown in FIG. 10, the twelve storage drives D in the storage case 171 are arranged horizontally in a three (rows) by four (columns) arrangement. Referring to FIG. 11, the storage case 171 comprises three column partitions 1711 and a plurality of row rails 1712, and each column partition 1711 has a double layered structure with the plurality of row rails 1712 integrated thereon. Back to FIG. 10-1, as the air drawn from the first corridors FC entering the storage modules 17 via the air holes 1721 on the drive bays 172, the air passes passages P next to the storage drives D. In one embodiment, the passages P are defined by spaces above the top of the storage drives D. When the air travels through the passages P, the air is in direct contact with the storage drives D, and thus taking heat away mostly from top of the storage drives D. After passing through the passages P, the air leaves the storage modules 17 and enters the second corridor SC via slits 181 on the circuit boards 18 which are behind the storage modules 17.

Figure 12:
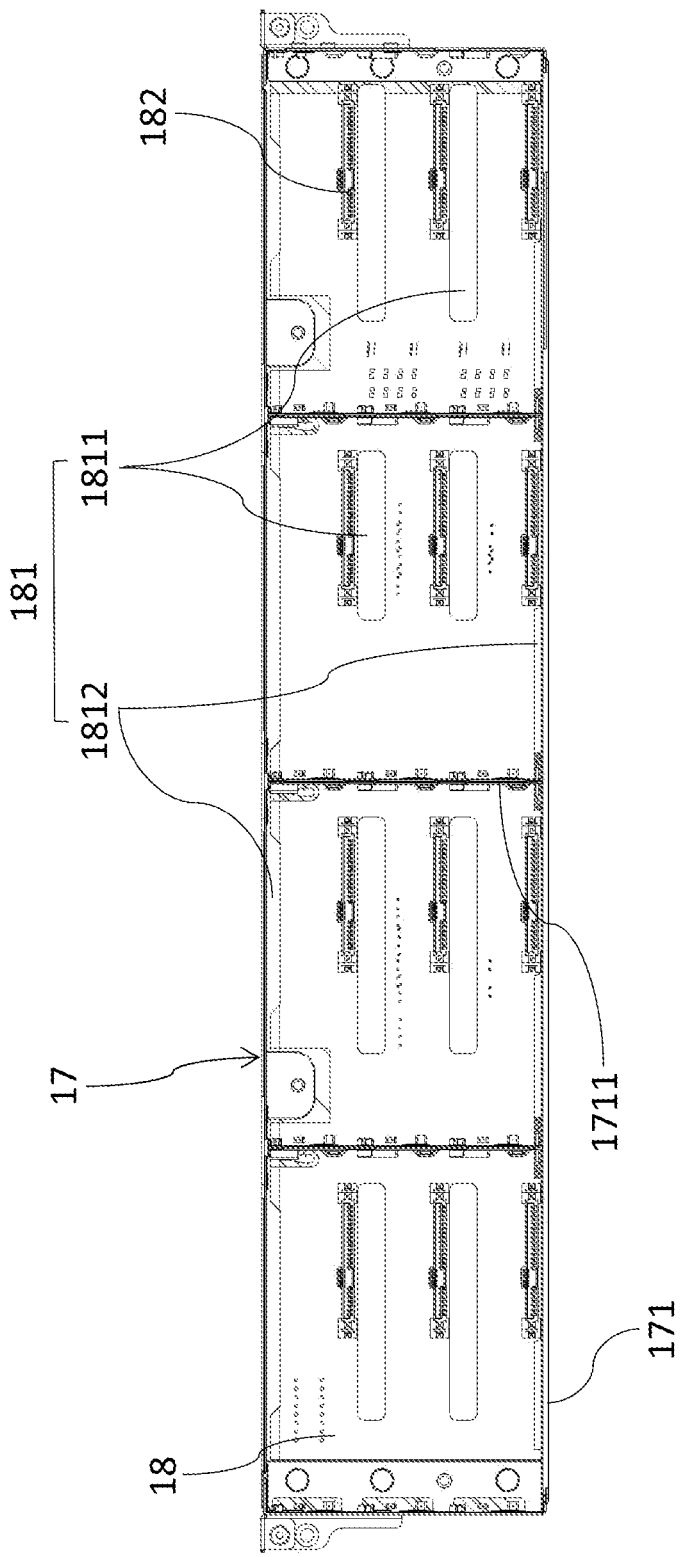
FIG. 12 illustrates a same point of view as that shown in FIG. 10 without showing the drive bays and the storage drives, according to one embodiment of the present disclosure.

According to one embodiment of the present disclosure, FIG. 12 illustrates FIG. 10 without showing the drive bays 172 and the storage drives D. As depicted by FIG. 12, when all the drive bays 172 and the storage drives D are removed from the storage case 171 of a storage module 17, the circuit board 18 arranged behind the storage module 17 can be seen from the front thereof. In other words, the storage case 171 is a box with its front being empty and back being the circuit board 18. In one embodiment, one circuit board 18 comprises multiple columns of slits 181, and the number of columns of slits 181 is corresponding to the number of columns of storage drives D. In other words, each column of drive bays 172 with storage drives D therein can have a column of slits 181 therebehind. Therefore, air passing through the passages P of the storage modules 17 can flow into the second corridor SC effectively without converging horizontally. In one embodiment of the present disclosure, the slits 181 comprise at least a major slit 1811 and a minor slit 1812. As depicted in FIG. 12, the major slits 1811 are arranged at non-edge portion of the circuit board 18, whereas the minor slits 1812 are arranged at edge portion of the circuit board 18. In other words, the major slits 1811 are holes on the circuit board 18, and the minor slits 1811 are notches at the edge of the circuit board 18. In one embodiment of the present disclosure, the circuit board 18 comprises at least a minor slit 1812 at its top edge. In another embodiment, the circuit board 18 comprises minor slits 1812 at both top edge and bottom edge thereof. In yet another embodiment, the circuit board 18 further comprises a plurality of drive connectors 182 configured to couple to the storage drives D. Since the drive connectors 182 is one of the major components that retains heat, each of the drive connectors 182 is arranged in proximity to any one of the slits 181 for effective cooling thereof. Though the slits 181 are shown long and narrow, it should be understood that the slits 181 are not limited in shape in practice as long as they allow the air from the passages P to pass through. For example, each slit 181 can be substituted with multiple equivalent round holes.

Figure 13:
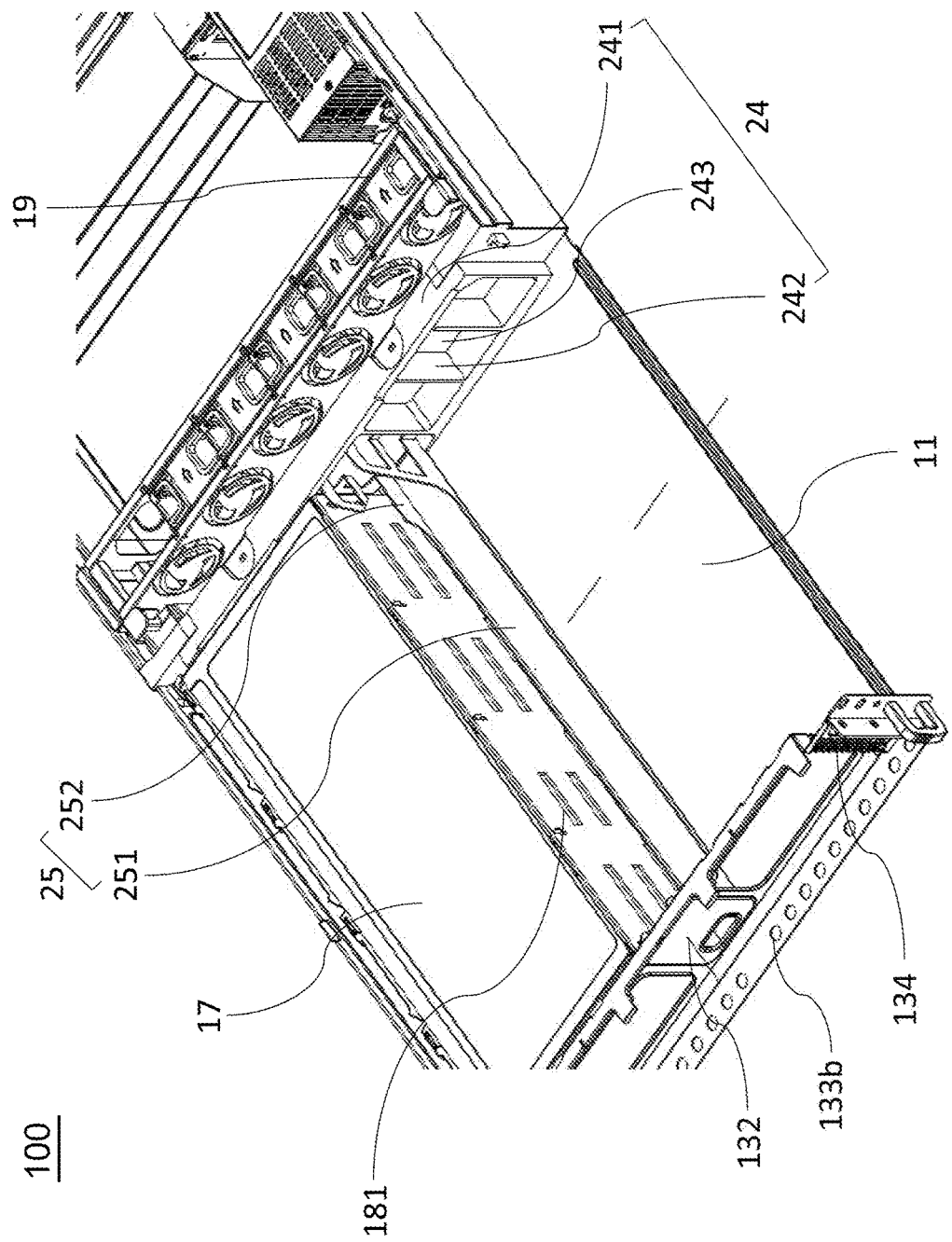
FIG. 13 is a partial enlargement PE of FIG. 8 according to one embodiment of the present disclosure.

FIG. 13 is a partial enlargement PE of FIG. 8 according to one embodiment of the present disclosure. The first support 24 is arranged across the base 11 in a side to side direction between the side walls 15 with respect to the server system 100 and configured to increase the structural strength of the base 11 of the server system 100. The first support 24 comprises a frame 241 and a plurality of dividers 242, and a plurality of openings 243 are defined between the plurality of dividers 242 within the frame 241. The plurality of openings 243 not only allows the air drawn by the fan module 19 from the second corridor SC to pass the first support 24, but also allows cables (not shown) coupled to the circuit boards 18 to pass through as well, and hence the cables can couple to the motherboard. The server system 100 further comprises a second support 25 arranged between the storage modules 17 and is perpendicular to the first support 24 and the front panel 13 as such. Furthermore, the second support 25 comprises a body 251 and a plurality of wings 252. The body 251 arranged between the front panel 13 and the first support 24 has two ends; one end of the body 251 extends toward the front panel 13, whereas the other end of the body 251 extends toward the first support 24. The plurality of wings 252 extended perpendicularly at the two ends of the body 251 are configured to couple the second support 25 to the first support 24 and the internal frame 132, and the structural strength of the server system 100 between the first support 24 and the front panel 13 is increased by the second support 25 as such. It should be noted that, the second support 25 is not necessary to be in direct contact with the base 11. However, the support 25 can be connected directly to the base 11 and/or the storage modules 17 for further structural reinforcement of the server system 100. In one embodiment of the present disclosure, the second support 25 comprises two wings 252 at each end. At the end proximal to the first support 24, and the two wings 252 each couple to one of the dividers 242 of the first support 24, and thus allowing air and cables (not shown) from the circuit boards 18 to pass through therebetween. At the end proximal to the front panel 13, the cables (not shown) from a UI module 23 pass between the wings 252. In sum, both cables from the circuit boards 18 and the UI module 23 can be neatly arranged between the wings 252 of the second support 25.

Figure 14:
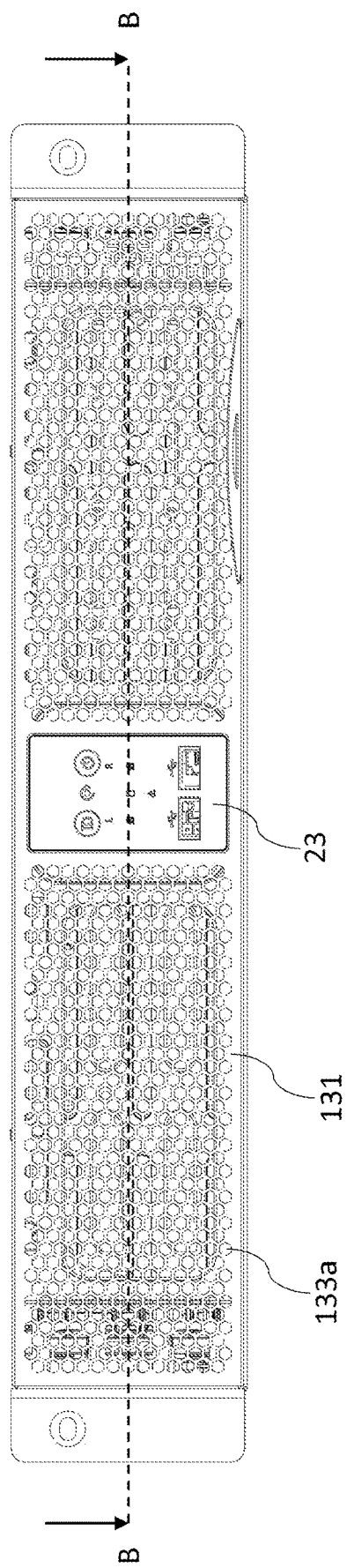
FIG. 14 illustrates a front view of the front panel according to one embodiment of the present disclosure.
Figure 15:
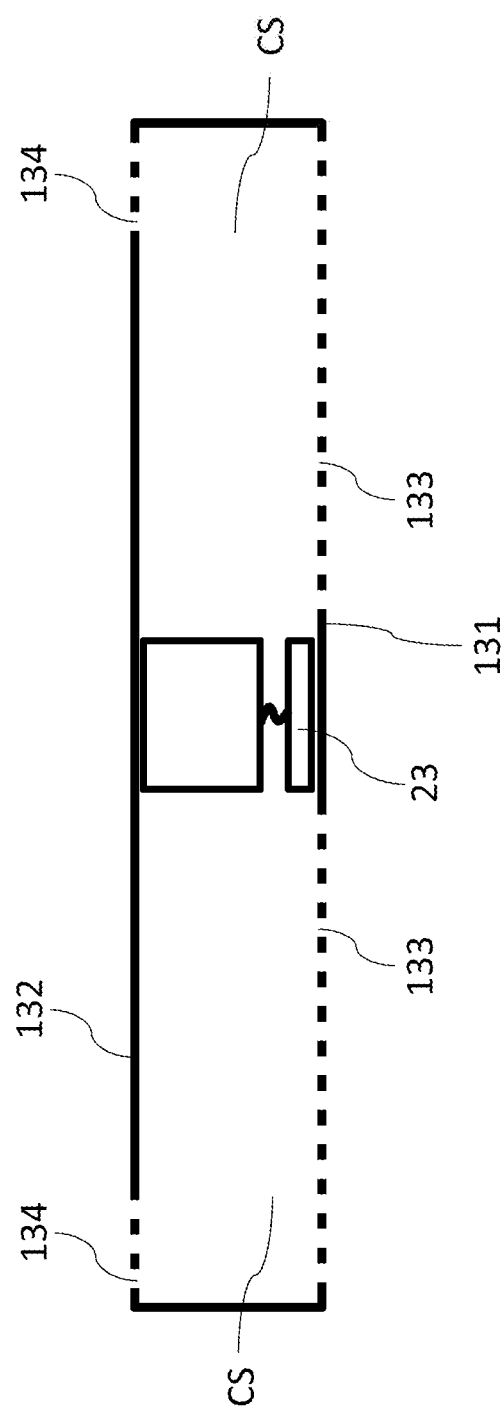
FIG. 15 is a simplified sectional illustration of the B-B cross-section as shown in FIG. 14.

According to one embodiment of the present disclosure, FIG. 14 illustrates a front view of the front panel 13; FIG. 15 is a simplified illustration of a B-B cross-sectional view of FIG. 14. The server system 100 further comprises an UI module 23 installed in the middle of the front panel 13 between the external frame 131 and the internal frame 132, such that at least partially divides the collecting space CS into two equal sections. Moreover, the UI module 23 is configured to separate the collecting space CS from the second corridor SC.

Figure 16:
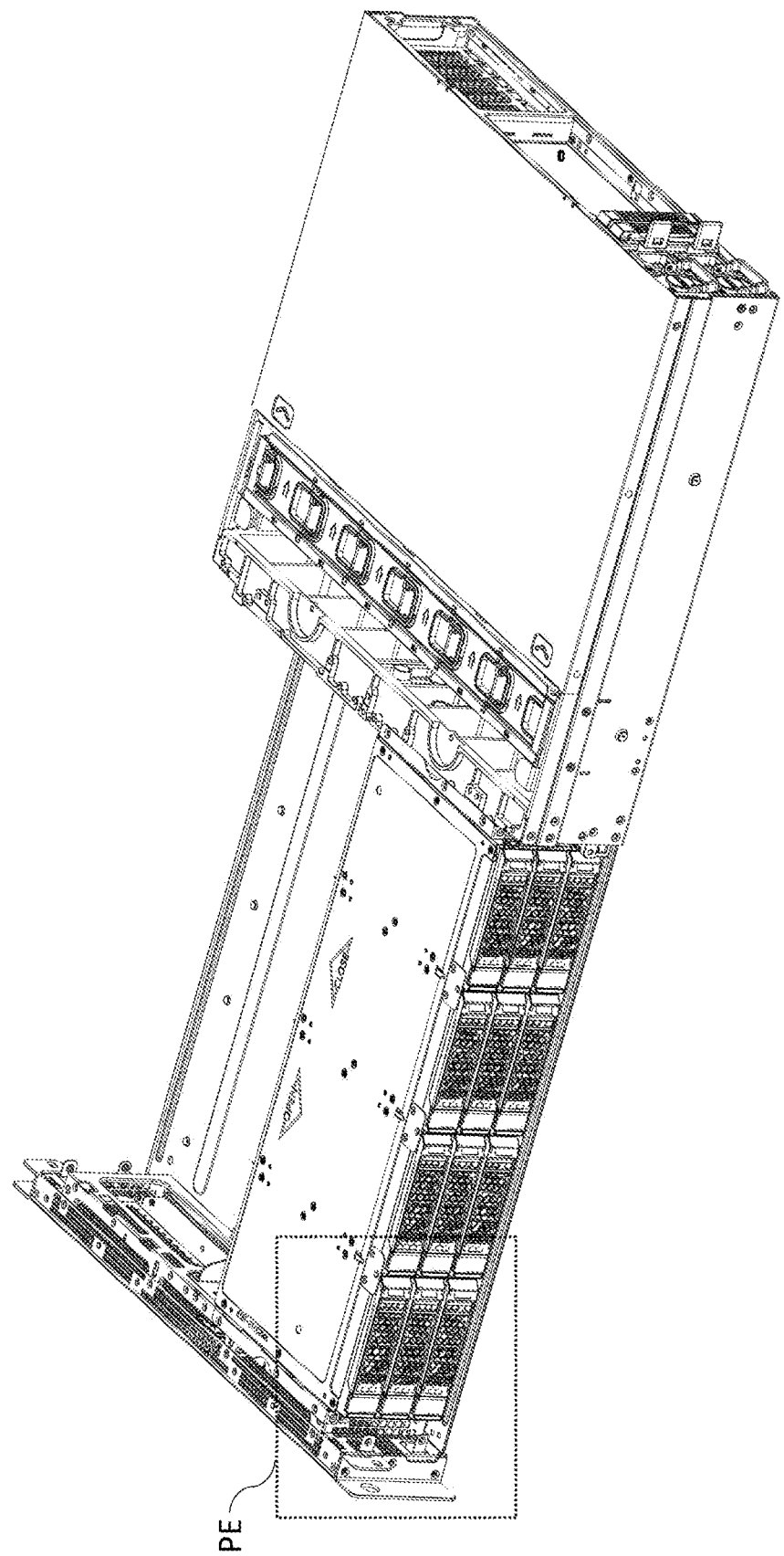
FIG. 16 illustrates another isometric view of the server system according to one embodiment of the present disclosure.
Figure 17:
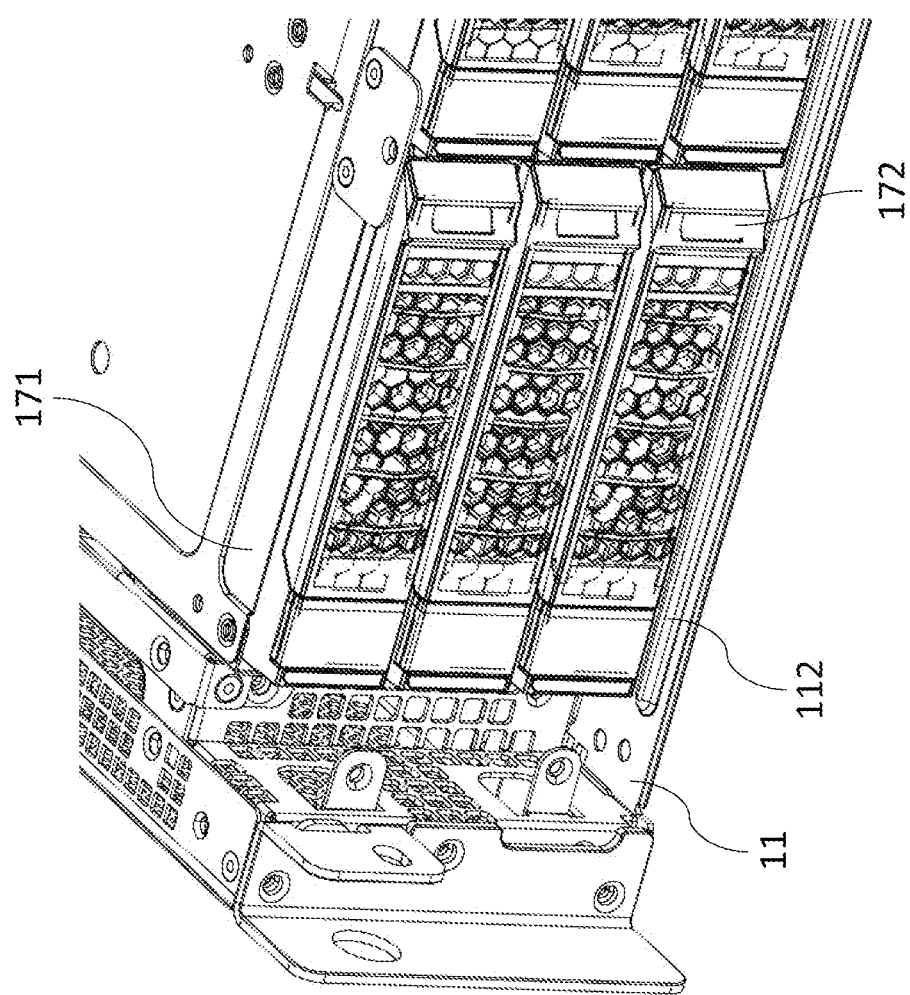
FIG. 17 shows a partial enlargement PE of FIG. 16 according to one embodiment of the present disclosure.

FIG. 16 illustrates the server system 100, and FIG. 17 shows a partial enlargement PE of FIG. 16. In one embodiment of the present disclosure, in the first corridor FC, the base 11 further comprises a bump 112 between a storage module 17 and a door 16 corresponding to the storage module 17. The bump 112 is configured to support the drive bays 172 and the storage drives D at the most bottom row of the storage module 17 when they are inserted to or removed from the storage case 171 of the storage module 17, and therefore preventing the drive bays 172 at the most bottom row from rubbing against the base 11 due to the weight of the storage drives D.

Figure 18:
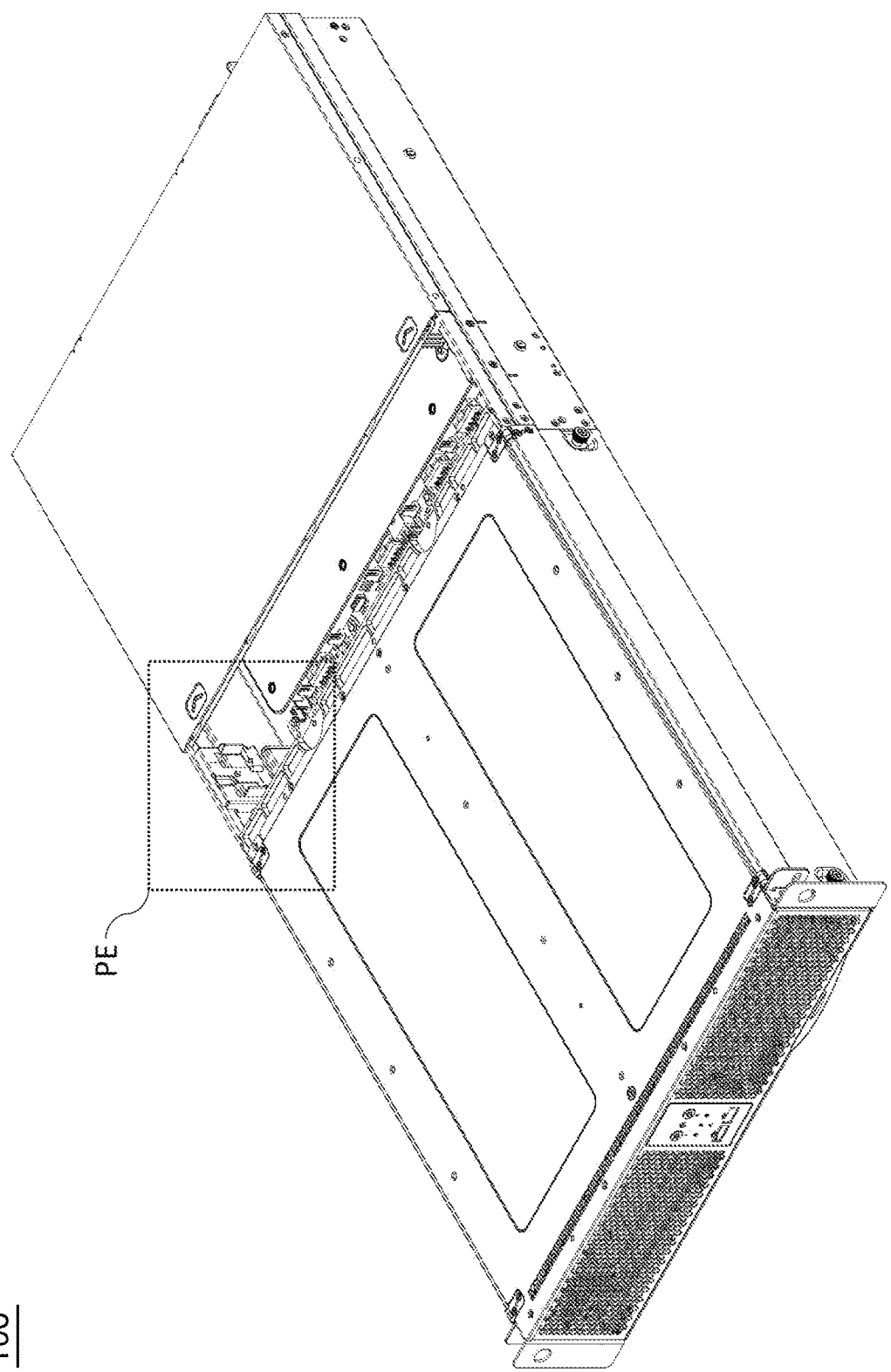
FIG. 18 illustrates another isometric view of the server system according to one embodiment of the present disclosure.
Figure 19:
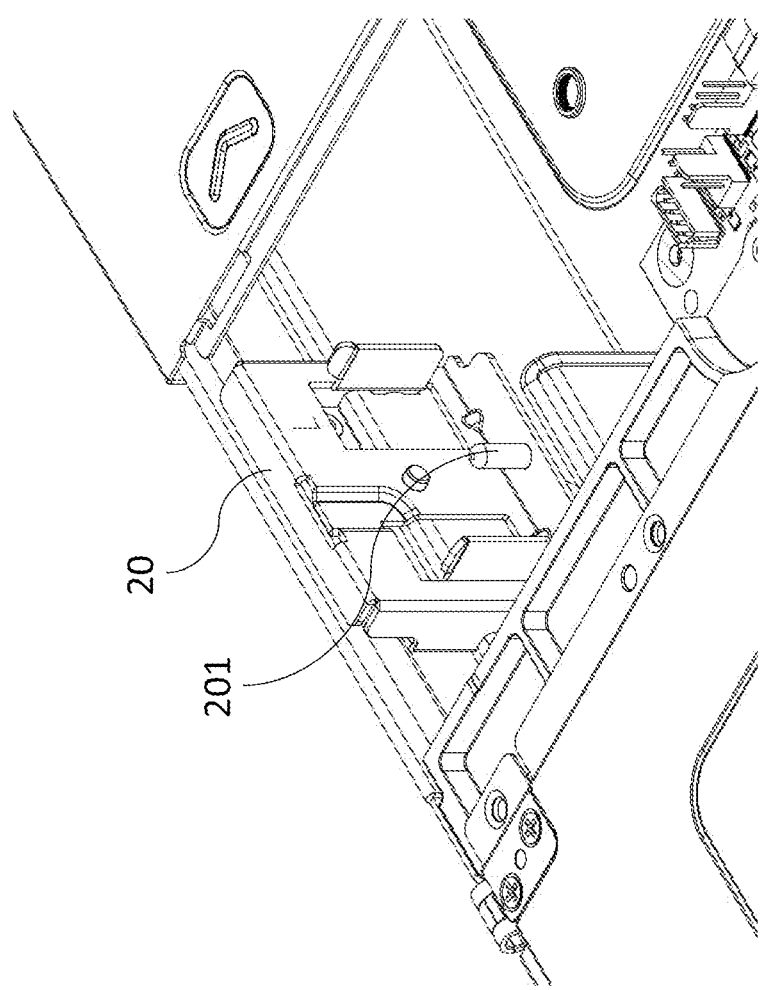
FIG. 19 illustrates a partial enlargement PE of FIG. 18 according to one embodiment of the present disclosure.
Figure 20:
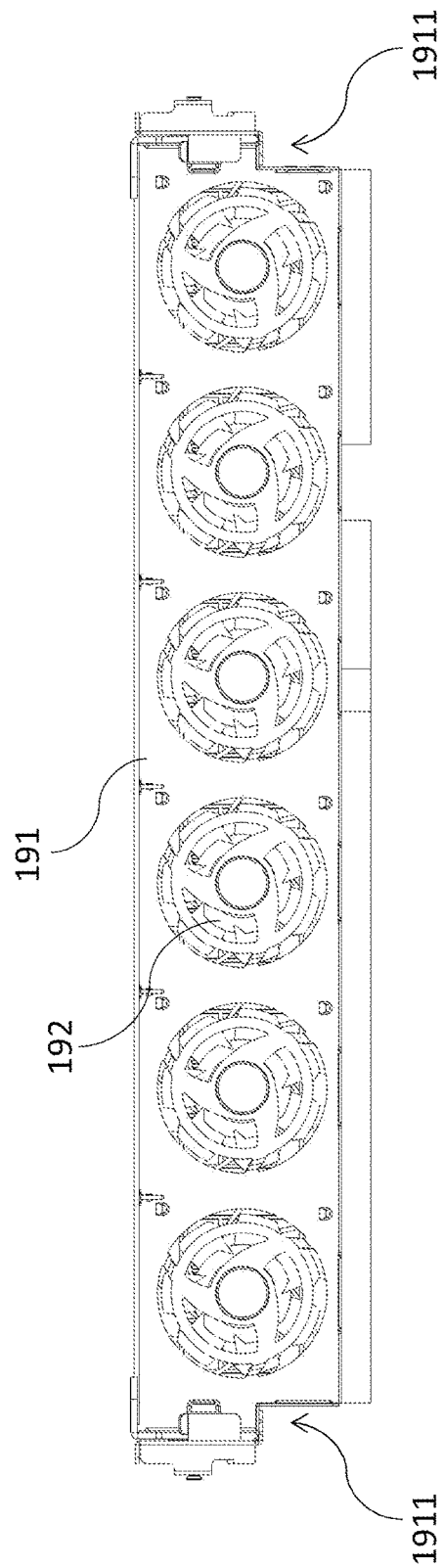
FIG. 20 illustrates a front view of a fan module according to one embodiment of the present disclosure.
Figure 21:
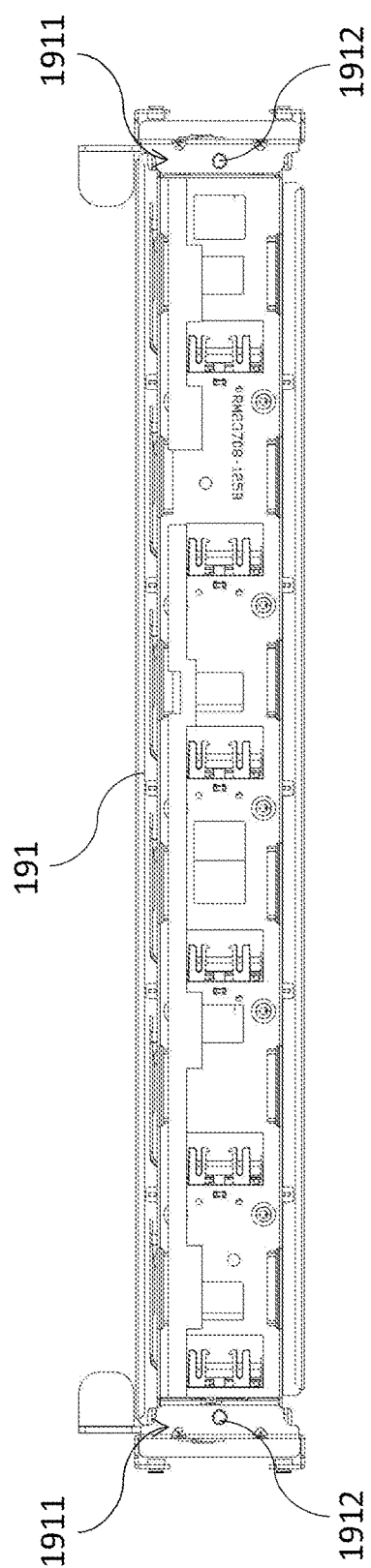
FIG. 21 illustrates a bottom view of the fan module according to one embodiment of the present disclosure.
Figure 22:
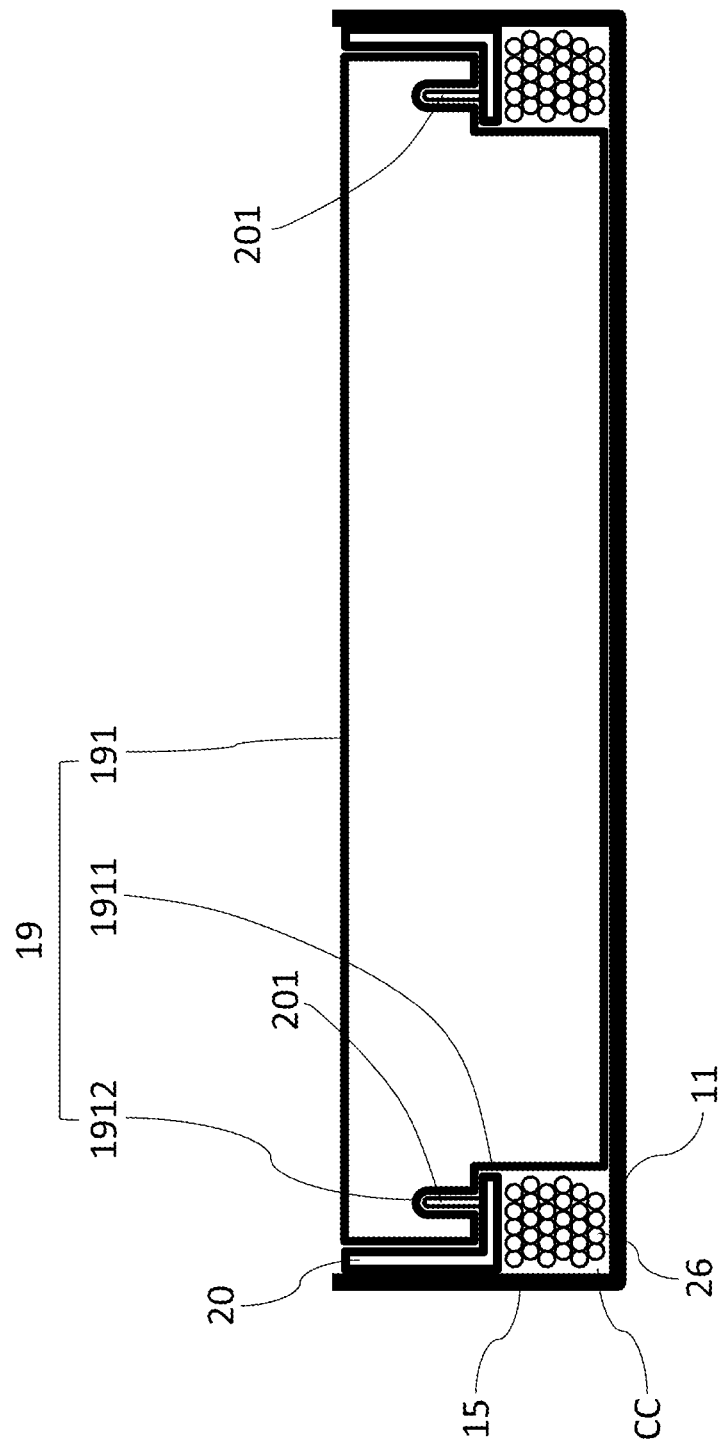
FIG. 22 is a simplified illustration of C-C cross-section of FIG. 4 according to one embodiment of the present disclosure.

In one embodiment of the present disclosure, the fan module 19 comprises a fan bracket 191 and a plurality of fan units 192 disposed therein as shown in FIG. 8. FIG. 18 illustrates the server system 100 having the fan mounts 20, and FIG. 19 shows a partial enlargement PE of FIG. 18; FIG. 20 illustrates a front view of the fan module 19, and FIG. 21 illustrates a bottom view of the fan module 19; FIG. 22 is a simplified illustration of C-C cross-section of FIG. 4. In one embodiment of the present disclosure, the pair of fan mounts 20 are fixed to the side walls 15 without direct connection to the base 11. In other words, the pair of fan mounts 20 are floating with respect to the base 11. Each of the fan mounts 20 comprises a guiding structure 201 which is configured to couple to the fan module 19. As shown in FIG. 20, the fan bracket 191 of the fan module 19 comprises two recess portions 1911, which looks like a notch at each lower corner, is arranged one at a side of the fan bracket 191. In FIG. 21, the fan bracket 191 further comprises two receiving structures 1912 integrated on the recess portions 1911 and configured to receive the guiding structures 201 of the fan mounts 20. As depicted by FIG. 19, the guiding structure 201 can be an upward protrusion standing vertically with respect to the base 11; the receiving structures 1912 can be apertures located at a downward facing portion of the recess portions 1911 as shown in FIG. 21. Therefore, installation of the fan bracket 191 of the fan module 19 to the server system 100 can be guided by alignment between the receiving structures 1912 and corresponding guiding structures 201. It should be noted that, the recess portions 1911 of the fan bracket 191 is not only configured to guide the installation to the fan mounts 20 by the receiving structures 1912 formed thereon, but also to allows the cables 26 from the circuit boards 18 and the UI module 23 to bypass the fan module 19 between corners of the fan module 19, the side walls 15, and the base 11. As shown in FIG. 22, a cable channel CC is defined between the side walls 15, the base 11, and the recess portions 1911 of the fan bracket 191, and the cable channel CC is configured to accommodate the cables 26 and which run from the circuit boards 18 and the UI module 23 to the motherboard arranged behind the fan module 19. Therefore, bypassing of the fan module 19 is achieved by the cable channel CC below the recess portions 1911. In another embodiment, a plurality of fan units 192 can be installed to the server system 100 without the fan bracket 191, in which the plurality of fan units 192 are arranged in a door to door direction with respect to the server system 100.

Figure 23:
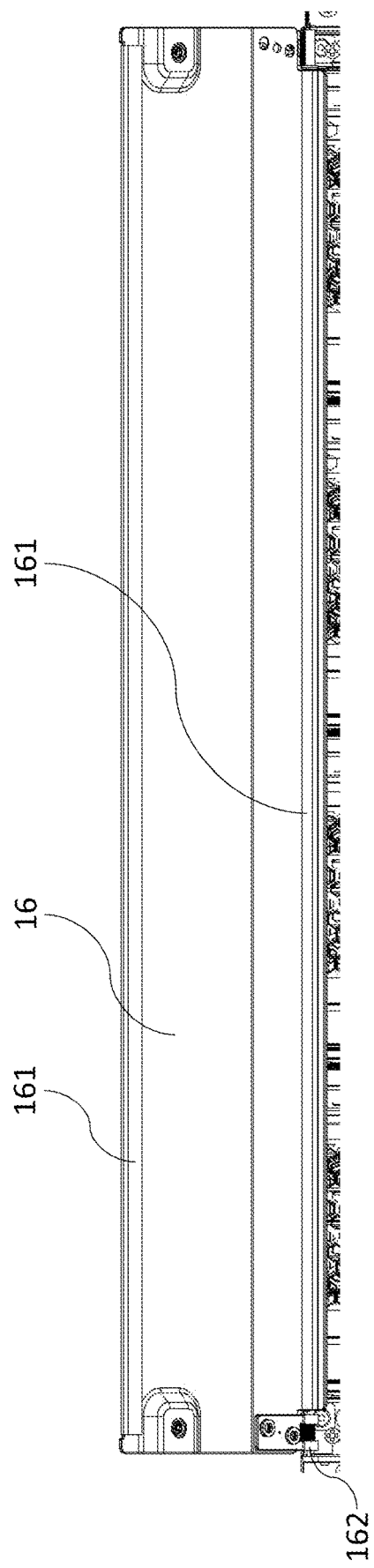
FIG. 23 is a partial enlargement of FIG. 9 according to one embodiment of the present disclosure.

FIG. 23 is a partial enlargement of FIG. 9. In one embodiment of the present disclosure, the door 16 can comprise at least one seal 161. As depicted by FIG. 9, the door 16 comprises two seals 161 on inner face thereof and a door hinge 162 coupled to the top cover 12. As such, the door 16 can be opened by lifting one end proximal to the base 11. However, in another embodiment, the door hinge 162 can also be coupled to the base 11, such that facilitate the door 16 to be opened by dropping one end proximal to the top cover 12. When the door 16 is closed, one seal 161 is arranged proximal to the base 11, whereas the other seal 161 is arranged proximal to the top cover 12. In other words, one seal 161 is installed near the door hinge 162, while the other is installed away from the door hinge 162.

Figure 24:
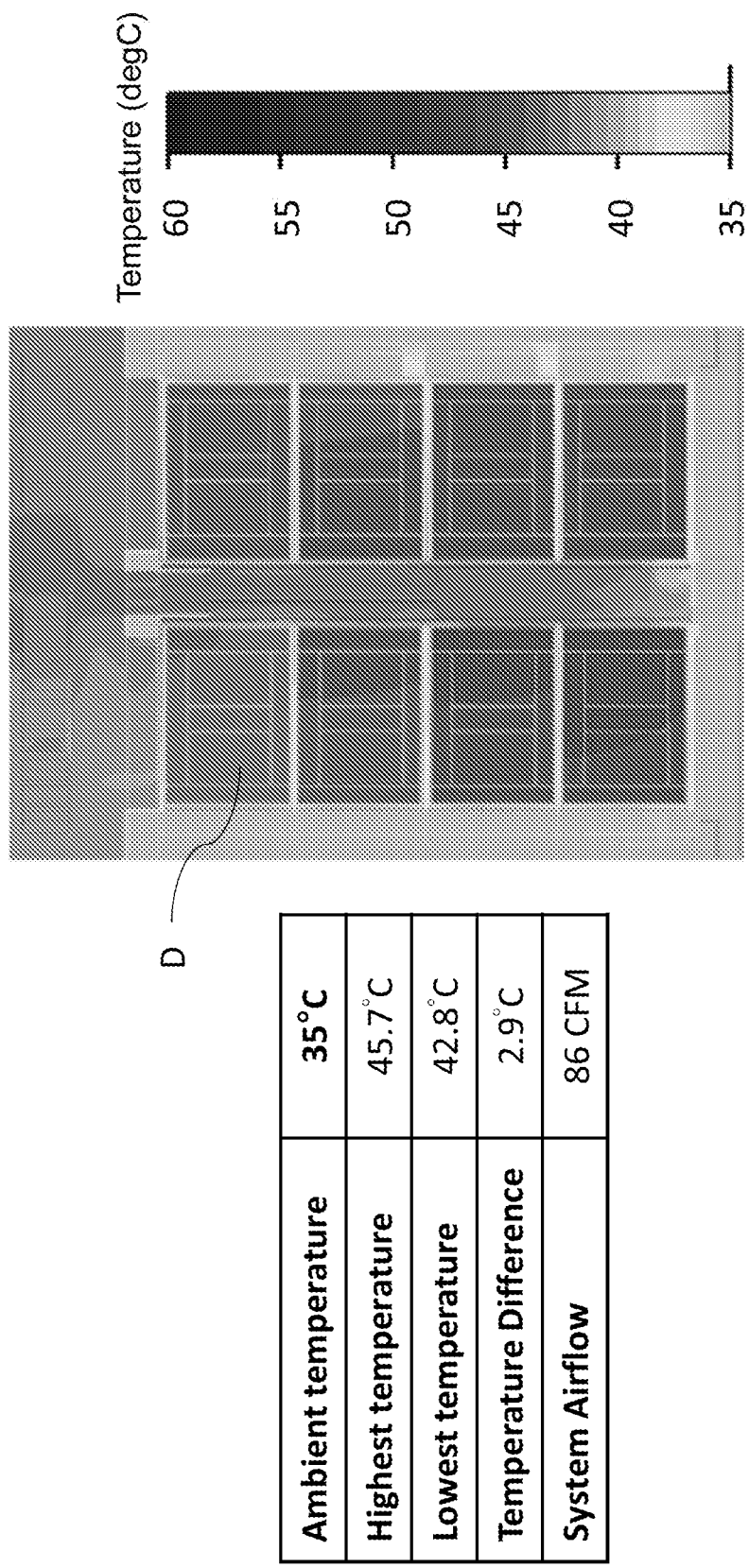
FIG. 24 is a cooling test result of the server system according to one embodiment of the present disclosure.

In one embodiment of the present disclosure, the plurality of storage drives D is 3.5-inch in size. A 3.5-inch storage drive usually outperforms a 2.5-inch storage drive in cache size, RPM (revolution per minute), maximum storage capacity, data transfer speed, and price. However, the 3.5-inch storage drive has a higher power consumption than a 2.5-inch storage drive, hence higher operational temperature. The high operational temperature in combination with the storage module 17 being tightly packed with the 3.5-inch storage drives D, cooling of the server system 100 becomes a very serious issue. According to a cooling test result shown in FIG. 24, the cooling arrangement in FIG. 5 cools the storage drives D in operation with a result of temperature difference at 2.9 degrees Celsius and highest temperature at 45.7 degrees Celsius between the storage drives D. The low temperature difference shows an even and balance cooling across the storage drives D, whereas the highest temperature being lower than 50 degrees Celsius satisfies the general industrial standard of being safe and stable. It should be noted that, the air flowing within the server system 100 between the fan module 19 and the front panel 13 is laminar flow, and the air flowing between the fan module 19 and the back panel 14 is turbulent flow, and the same cooling arrangement can be applied to the storage drives D in 2.5 inch, as long as the physical capacity of the storage case 171 occupied by the drive bays 172 and the storage drives D is more than 70%.

Figure 25:
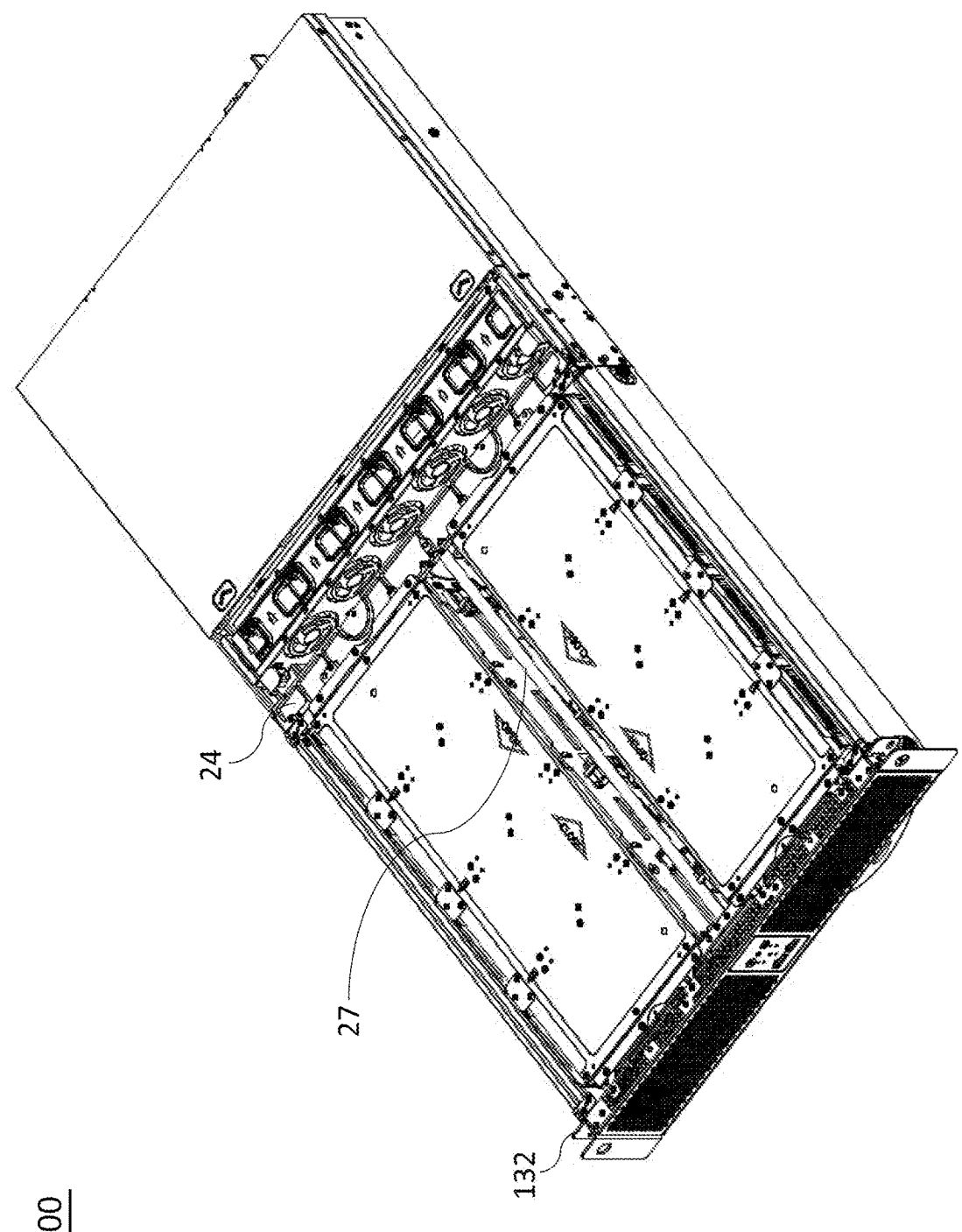
FIG. 25 illustrates another isometric view of the server system according to one embodiment of the present disclosure.

Moreover, the weight of a 3.5-inch storage drive is approximately four times of the weight of a 2.5-inch storage drive. Therefore, carrying twenty-four 3.5-inch storage drives D at a front portion FP of the server system 100 as shown in FIG. 3 puts a lot of stress to the base 11. FIG. 25 illustrates the server system 100 with a third support 27 according to one embodiment of the present disclosure. To further enhance the structural strength of the base 11, the third support 27, other than the first support 24 and the second support 25, can be included in the second corridor SC and coupled between the first support 24 and the internal frame 132. However, the server system 100 can include at least one from the first support 24, the second support 25, and the third support 27 in any combination thereof according to one embodiment of the present disclosure.

It should be noted that, though all the exemplary illustrations are based on a 2 U rack mount server, any embodiment of the present disclosure can be incorporated in any other rack mount servers with different dimension, such as 4 U, 6 U, and 8 U rack mount servers.

The embodiments shown and described above are only examples. Many details are often found in this field of art thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A server system comprising:
   a base;
   a front panel arranged on the base and defining a collecting space; two doors, respectively arranged on opposite sides of the base, and being perpendicular to the front panel;
   two storage cases arranged between the doors in back to back arrangement, and configured to receive multiple rows and columns of a plurality of horizontally arranged storage drives at front of the two storage cases, wherein two first corridors parallel to each other are each defined between one of the doors and one of the storage case facing the one door, and the two storage cases are configured to receive the plurality of storage drives in such a way that every storage drive is at least partially exposed to one first corridor that is next to the storage drive;
   two circuit boards arranged between the two storage cases, wherein the two circuit boards comprise a plurality of slits, wherein a second corridor parallel to the two first corridors is defined between the two circuit boards;
   a storage cover disposed above the base over the two first corridors, the second corridor, the two storage cases, and the two circuit boards; and
   a fan bracket arranged on the base in a door to door direction and configured to receive a fan unit to introduce air into the server system through the collecting space, the two first corridors, the two storage cases, the plurality of slits on the two circuit boards and the second corridors in sequence, wherein the storage cases are between the fan bracket and the front panel.

2. The server system of claim 1, further comprising an air stopper arranged at ends of the two first corridors away from the front panel, and the air stopper is configured to stop air in the first corridor from flowing toward the fan bracket without passing through the storage cases and the circuit boards.

3. The server system of claim 2, wherein the air stopper is a first support arranged between the fan bracket and the storage cases in door to door direction with respect to the server system, and configured to increase structural strength of the server system, wherein the first support comprises an opening communicating the second corridor and the fan bracket.

4. The server system of claim 1, wherein the collecting space is perpendicular to the second corridor.

5. The server system of claim 1, wherein the collecting space is not in direct communication with the second corridor.

6. The server system of claim 5, further comprising an UI module configured to separate the collecting space from the second corridor.

7. The server system of claim 1, wherein the front panel comprises a plurality of air inlets and a plurality of air outlets, and the collecting space is further defined between the plurality of air inlets and the plurality of air outlets, and wherein a total area of the plurality of air inlets is larger than a total area of the plurality of air outlets.

8. The server system of claim 1, wherein a length of one of the doors is equal to or longer than a length of one of the storage cases.

9. The server system of claim 1, wherein the plurality of slits is arranged in multiple columns on one of the circuit boards behind one of the storage cases, and a number of the multiple columns of the plurality of slits on the one circuit board is corresponding to a number of columns of the plurality of storage drives the one storage case configured to receive.

10. The server system of claim 1, wherein the plurality of slits comprises a minor slit arranged at a top edge of one of the two circuit boards.

11. The server system of claim 1, further comprising an UI module at least partially dividing the collecting space into two equal sections.

12. The server system of claim 1, further comprising two seals arranged on an inner face of one of the doors, wherein one of the seals is arranged proximal to the storage cover and the other is arranged proximal to the base when the one door is closed.

13. The server system of claim 1, wherein the storage cases are configured to receive multiple 3.5-inch storage drives.

14. The server system of claim 1, wherein one of the storage cases is further configured to receive the plurality of storage drives that occupies 70% or more of a physical capacity of the one storage case.

15. The server system of claim 1, wherein one of the circuit boards comprises multiple drive connectors, wherein each of the multiple drive connectors is arranged in proximity to any one of the plurality of slits.

16. The server system of claim 1, further comprising at least two from: a first support, a second support, and a third support.

17. The server system of claim 1, wherein the fan bracket comprises a recess portion allowing multiple cables from the circuit boards to bypass the fan bracket.

18. The server system of claim 1, further comprising a second support arranged between the storage cases and coupled perpendicularly to the front panel.

19. The server system of claim 1, further comprising a plurality of fan units disposed on one side of the storage cases while the front panel being on the other side of the storage cases, wherein the fan units are configured to draw air into the server system.

20. The server system of claim 1, wherein the base further comprises a bump between one of the storage cases and one of the doors corresponding to the one storage case, wherein the bump is configured to support the storage drives at a most bottom row of the one storage case when the storage drives are inserted or removed from the one storage case.

21. The server system of claim 1, wherein the two doors comprises a stepped structure each, and each stepped structure divides one door into an upper portion and a lower portion, and the lower portion is dented into the server system with respect to the upper portion, and wherein the two doors are configured to receive racking rails beneath the stepped structures when the server system is completely within a rack.

22. The server system of claim 1, further comprising a fan cover covering over the fan bracket, wherein the fan cover is configured to be removed individually from the server system.

23. The server system of claim 1, wherein one of the storage cases comprises a double layered column partition with a row rail integrated on the double layered column partition.

24. A server system comprising:
- a base;
- a front panel arranged on the base and defining a collecting space;
- two doors, respectively arranged on opposite sides of the base, and being perpendicular to the front panel;
- two storage cases arranged between the doors in back to back arrangement, and configured to receive multiple rows and columns of a plurality of horizontally arranged storage drives at front of the two storage cases, wherein two first corridors parallel to each other are each defined between one of the doors and one of the storage case facing the one door, and the two storage cases are configured to receive the plurality of storage drives in such a way that every storage drive is at least partially exposed to one first corridor that is next to the storage drive;
- two circuit boards arranged between the two storage cases, wherein the two circuit boards comprise a plurality of slits, wherein a second corridor parallel to the two first corridors is defined between the two circuit boards;
- a storage cover disposed above the base over the two first corridors, the second corridor, the two storage cases, and the two circuit boards; and
- a plurality of fan units arranged on the base in a door to door direction such that the storage cases are between the plurality of fan units and the front panel, and the plurality of fan units are configured to introduce air into the server system through the collecting space, the two first corridors, the two storage cases, the plurality of slits on the two circuit boards and the second corridors in sequence.

* * * * *